(12) United States Patent
Foster et al.

(10) Patent No.: US 9,179,538 B2
(45) Date of Patent: Nov. 3, 2015

(54) ELECTROMAGNETIC SHIELDING STRUCTURES FOR SELECTIVELY SHIELDING COMPONENTS ON A SUBSTRATE

(75) Inventors: James H. Foster, Palo Alto, CA (US); James W. Bilanski, Palo Alto, CA (US); Amir Salehi, San Jose, CA (US); Ramamurthy Chandhrasekhar, Cupertino, CA (US); Nicholas Unger Webb, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 56 days.

(21) Appl. No.: 13/488,382

(22) Filed: Jun. 4, 2012

(65) Prior Publication Data

US 2012/0320558 A1   Dec. 20, 2012

Related U.S. Application Data

(60) Provisional application No. 61/495,348, filed on Jun. 9, 2011.

(51) Int. Cl.
*H05K 9/00* (2006.01)
*H05K 1/02* (2006.01)
(Continued)

(52) U.S. Cl.
CPC ............ *H05K 1/0218* (2013.01); *H01L 23/552* (2013.01); *H05K 9/003* (2013.01);
(Continued)

(58) Field of Classification Search
CPC .... H05K 9/0037; H05K 9/0033; H05K 9/003
USPC ........................... 174/377, 382, 384; 361/818
See application file for complete search history.

(56) References Cited

U.S. PATENT DOCUMENTS 638,820 A  12/1899  Swaab et al.
753,796 A   3/1904  Jarvis et al.
(Continued)

FOREIGN PATENT DOCUMENTS

JP  H04-079352 A  12/1992
JP  H06-041198    2/1994
(Continued)

OTHER PUBLICATIONS

Henkel Electronics, "PCB Protection with Macromelt," Jan. 13, 2011. Retrieved from the Internet: <URL:http://www.youtube.com/watch?v=0yBYU_QHibw>.
(Continued)

*Primary Examiner* — Hung V Ngo
(74) *Attorney, Agent, or Firm* — Treyz Law Group; Joseph F. Guihan

(57) ABSTRACT

Electronic components on a substrate may be shielded using electromagnetic shielding structures. Insulating materials may be used to provide structural support and to help prevent electrical shorting between conductive materials and the components. The shielding structures may include compartments formed using metal fences that surround selected components or by injection molding plastic. The shielding structures may be formed using metal foil wrapped over the components and the substrate. Electronic components may be tested using test posts or traces to identify components that are faulty. The test posts or traces may be deposited on the substrate and may be used to convey test signals between test equipment and the components. After successful testing, the test posts may be permanently shielded. Alternatively, temporary shielding structures may be used to allow testing of individual components before an electronic device is fully assembled.

8 Claims, 26 Drawing Sheets

(51) Int. Cl.
*H01L 23/552* (2006.01)
*H01L 25/065* (2006.01)

(52) U.S. Cl.
CPC .......... *H05K 9/0026* (2013.01); *H05K 9/0043* (2013.01); *H01L 25/0655* (2013.01); *H01L 2924/0002* (2013.01); *H01L 2924/14* (2013.01); *H01L 2924/15192* (2013.01); *H01L 2924/1815* (2013.01); *H01L 2924/19041* (2013.01); *H01L 2924/19043* (2013.01); *H01L 2924/19105* (2013.01); *H05K 9/0033* (2013.01); *H05K 9/0037* (2013.01); *Y10T 29/49004* (2015.01); *Y10T 29/4913* (2015.01); *Y10T 29/49146* (2015.01)

(56) References Cited

U.S. PATENT DOCUMENTS

| | | | |
|---|---|---|---|
| 4,717,990 A | 1/1988 | Tugcu | |
| 4,994,659 A | 2/1991 | Yabe et al. | |
| 5,177,324 A | 1/1993 | Carr et al. | |
| 5,316,165 A | 5/1994 | Moran, Jr. | |
| 5,461,545 A | 10/1995 | Leroy et al. | |
| 5,600,181 A | 2/1997 | Scott et al. | |
| 5,689,878 A | 11/1997 | Dahringer et al. | |
| 5,694,300 A | 12/1997 | Mattei et al. | |
| 5,761,053 A | 6/1998 | King et al. | |
| 5,981,043 A | 11/1999 | Murakami et al. | |
| 5,987,739 A | 11/1999 | Lake | |
| 5,990,989 A | 11/1999 | Ozawa | |
| 6,218,610 B1 | 4/2001 | Suzuki | |
| 6,326,544 B1 | 12/2001 | Lake | |
| 6,455,936 B1 | 9/2002 | Lo et al. | |
| 6,483,719 B1 | 11/2002 | Bachman | |
| 6,492,194 B1 | 12/2002 | Bureau et al. | |
| 6,600,101 B2 | 7/2003 | Mazurkiewiez | |
| 6,659,512 B1 | 12/2003 | Harper et al. | |
| 6,671,183 B2 | 12/2003 | Tsuzuki | |
| 6,683,245 B1 * | 1/2004 | Ogawa et al. | 174/382 |
| 6,733,954 B2 | 5/2004 | Yamamoto et al. | |
| 6,738,249 B1 | 5/2004 | Anthony et al. | |
| 6,940,010 B2 | 9/2005 | Cunningham et al. | |
| 6,952,046 B2 | 10/2005 | Farrell et al. | |
| 6,977,187 B2 | 12/2005 | Farrell et al. | |
| 7,089,646 B2 | 8/2006 | Leerkamp | |
| 7,095,627 B2 | 8/2006 | Yokota | |
| 7,102,896 B2 | 9/2006 | Ajioka et al. | |
| 7,177,161 B2 | 2/2007 | Shima | |
| 7,180,012 B2 | 2/2007 | Tsuneoka et al. | |
| 7,196,275 B2 * | 3/2007 | Babb et al. | 174/382 |
| 7,214,889 B2 | 5/2007 | Mazurkiewicz | |
| 7,381,906 B2 | 6/2008 | Holmberg | |
| 7,446,265 B2 | 11/2008 | Krohto et al. | |
| 7,476,566 B2 | 1/2009 | Farrell et al. | |
| 7,501,587 B2 | 3/2009 | English | |
| 7,506,436 B2 | 3/2009 | Bachman | |
| 7,586,185 B2 | 9/2009 | Fukasawa | |
| 7,639,513 B2 * | 12/2009 | Otsuki | 361/818 |
| 7,643,311 B2 | 1/2010 | Coffy | |
| 7,649,499 B2 | 1/2010 | Watanabe | |
| 7,651,889 B2 | 1/2010 | Tang et al. | |
| 7,745,910 B1 | 6/2010 | Olson et al. | |
| 7,898,066 B1 | 3/2011 | Scanlan et al. | |
| 7,906,371 B2 | 3/2011 | Kim et al. | |
| 7,920,367 B2 | 4/2011 | Anthony et al. | |
| 7,972,901 B2 | 7/2011 | Farrell et al. | |
| 7,989,928 B2 | 8/2011 | Liao et al. | |
| 8,008,753 B1 | 8/2011 | Bologna | |
| 8,022,511 B2 | 9/2011 | Chiu et al. | |
| 8,030,750 B2 | 10/2011 | Kim et al. | |
| 8,093,690 B2 | 1/2012 | Ko et al. | |
| 8,093,691 B1 | 1/2012 | Fuentes et al. | |
| 8,110,902 B2 | 2/2012 | Eun et al. | |
| 8,212,339 B2 | 7/2012 | Liao et al. | |
| 8,212,340 B2 | 7/2012 | Liao | |
| 8,279,625 B2 | 10/2012 | Just et al. | |
| 8,654,537 B2 | 2/2014 | Fisher et al. | |
| 2001/0054754 A1 | 12/2001 | Inoue | |
| 2002/0119585 A1 | 8/2002 | Yamazaki et al. | |
| 2002/0153360 A1 | 10/2002 | Yamazaki et al. | |
| 2002/0192931 A1 | 12/2002 | Hayakawa | |
| 2003/0057544 A1 | 3/2003 | Nathan et al. | |
| 2004/0121602 A1 | 6/2004 | Maruyama et al. | |
| 2004/0233035 A1 | 11/2004 | Fjelstad | |
| 2004/0259389 A1 | 12/2004 | Yamazaki et al. | |
| 2005/0064685 A1 | 3/2005 | Hayakawa | |
| 2006/0086518 A1 | 4/2006 | Kawaguchi et al. | |
| 2006/0152913 A1 | 7/2006 | Richey et al. | |
| 2007/0120132 A1 | 5/2007 | Maruyama et al. | |
| 2008/0210462 A1 * | 9/2008 | Kawagishi et al. | 29/841 |
| 2009/0223711 A1 | 9/2009 | Ueno et al. | |
| 2009/0289548 A1 | 11/2009 | Maruyama et al. | |
| 2009/0289755 A1 | 11/2009 | Yu et al. | |
| 2010/0246143 A1 * | 9/2010 | Dinh et al. | 361/748 |
| 2011/0063810 A1 | 3/2011 | Chen et al. | |
| 2012/0261181 A1 | 10/2012 | Izawa et al. | |
| 2013/0027897 A1 | 1/2013 | Just et al. | |

FOREIGN PATENT DOCUMENTS

| | | |
|---|---|---|
| JP | 10-051173 | 2/1998 |
| JP | 2001-339016 A | 12/2001 |
| JP | 2003-273571 | 9/2003 |
| JP | 3113508 | 7/2005 |
| JP | 2009212446 | 9/2009 |
| JP | 2009290141 | 12/2009 |

OTHER PUBLICATIONS

Henkel Electronics, "PCB Protection Overview," Mar. 16, 2011. Retrieved from the Internet: <URL:http://www.youtube.com/watch?v=LEslHhpzKyc&feature=related>.

Marchese, "Macromelt Hot Melts to Shape Electronics: Introductionto Products and Technology," Henkel Loctite Adhesives, Jun. 30, 2006, Casarile, Italy (22 pages).

* cited by examiner

ELECTROMAGNETIC SHIELDING STRUCTURES FOR SELECTIVELY SHIELDING COMPONENTS ON A SUBSTRATE

This application claims the benefit of provisional patent application No. 61/495,348, filed Jun. 9, 2011, which is hereby incorporated by reference herein in its entirety.

BACKGROUND

This relates generally to mitigating radio-frequency interference and, more particularly, to electromagnetic shielding structures that help isolate radio-frequency circuitry from radio-frequency interference.

Electronic devices such as computers, cellular telephones, and other devices often contain circuitry that requires electromagnetic shielding. For example, some electronic devices include radio-frequency transceiver circuits that are susceptible to radio-frequency interference. Electronic devices may also include memory and other components that use clock signals during normal operation. If care is not taken, signals from one circuit may interfere with the proper operation of another circuit. For example, a clock signal or a clock signal harmonic that falls within the operating band of a radio-frequency receiver may cause undesirable interference for a radio-frequency transceiver.

To protect from electromagnetic interference, circuits such as radio-frequency transceivers are typically enclosed within metal radio-frequency (RF) shielding cans. The metal of the shielding cans blocks radio-frequency signals and helps shield the enclosed components from electromagnetic interference (EMI). In a typical configuration, integrated circuit components are covered by RF shielding cans after being mounted on a printed circuit board.

Conventional arrangements in which radio-frequency shielding cans are mounted to a printed circuit board can help to reduce electromagnetic interference, but may be undesirably bulky. This may limit the effectiveness of radio-frequency shielding can arrangements in situations such as those in which compact shielding is desired.

It would therefore be desirable to provide improved radio-frequency shielding structures.

SUMMARY

Electronic devices may include electrical components mounted on one or more substrates. The electrical components may sometimes be referred to herein as electronic components. The electrical components may include radio-frequency transceiver circuits, clock circuits, processors, application-specific integrated circuits, and other electrical components. The substrate on which the components are mounted may be a rigid printed circuit board, a flexible printed circuit board, a plastic carrier, or other printed circuit substrates.

The electrical components may be sensitive to electromagnetic interference and may have the potential to generate electromagnetic interference for other components. To help protect the components from electromagnetic interference, at least one of the components on a substrate may be electromagnetically shielded. Electromagnetic shielding structures may be formed from insulating materials and conductive materials. The shielding structures may isolate components that are sensitive to electromagnetic interference from components that generate electromagnetic interference or from external sources of electromagnetic interference.

Shielding structures may be formed using manufacturing tools such as molding tools, cutting tools, heating tools, and deposition tools. Shielding structures may, for example, be formed by using laser cutting tools or other cutting tools to form compartments around components. Injection molding tools may also be used to form compartments around selected components. Substrates may be formed with sacrificial regions to accommodate manufacturing variances and to allow manufacturing tools to grip the substrate. The sacrificial regions of a substrate may later be removed to help reduce the dimensions of the device.

Solder walls or metal fences may be formed around selected components. Conductive paint, foil, metals, metal alloys, or other conductive materials may be used to form a conductive layer that covers the components. Insulating materials (e.g., dielectric materials) may be used to provide structural support to the conductive layer and to help prevent electrical shorting between the conductive layer and underlying components that are being shielded. The insulating materials may include compartments that cover the components.

With one suitable arrangement, conductive foil may be wrapped around a substrate to provide an electromagnetic shield for multiple components on the substrate. The conductive foil may be wrapped over a top surface of the substrate and side walls of the substrate. Alternatively, the conductive foil may be wrapped to enclose the entire substrate (e.g., to provide electromagnetic shielding when components are formed on multiple surfaces of the substrate).

Insulating structures having compartments may be formed from heat-shrink material. The insulating structures may be placed over the components and heated so that the compartments shrink to fit the components. A conductive layer may then be deposited over the insulating structures so that the components are shielded from electromagnetic interference.

Electronic components may be tested during the formation of shielding structures for the electronic components (e.g., to identify components that are faulty). The electronic components may be mounted to metal traces on a substrate. Metal test traces formed on the substrate may be coupled to the electronic components and may be left exposed during testing operations. If desired, test posts may be formed on the test traces. Testing operations may be performed by conveying and receiving test signals through the test traces using test equipment (e.g., a tester). After successful testing, the test traces may be electromagnetically shielded using additional shielding structures formed from insulating materials and conductive materials.

Temporary shielding structures may be used during testing. The temporary shielding structures may be adjustable and allow testing of individual components before an electronic device is fully assembled and provided with permanent electromagnetic shielding structures. For example, the shielding structures may be temporarily positioned to shield selected components during test operations. The temporary shielding structures may be removed after completion of testing.

Further features of the present invention, its nature and various advantages will be more apparent from the accompanying drawings and the following detailed description.

DETAILED DESCRIPTION

This relates to shielding structures for electrical components. The shielding structures may include radio-frequency shielding structures and/or magnetic shielding structures. The electrical components that are shielded by the shielding structures may be components such as integrated circuits that operate in radio-frequency bands (e.g., transceiver integrated circuits, memory circuits and other circuits with clocks that produce signals with fundamentals or harmonics in radio-frequency bands, etc.). Shielded components may also include circuitry formed from one or more discrete components such as inductors, capacitors, and resistors, switches, etc. The electrical components that are shielded may be aggressors (components that produce radio-frequency or magnetic signal interference) and/or victims (components that are sensitive to interference that is received from external sources).

The shielding structures may help to reduce interference from electromagnetic signals and may therefore sometimes be referred to as electromagnetic interference (EMI) shielding structures.

Electronic components may be mounted on one or more printed circuit boards in an electronic device. As an example, the electronic components may be surface-mount technology (SMT) components that are mounted directly onto a printed circuit board. The printed circuit boards may be formed from rigid printed circuit board materials such as fiberglass-filled epoxy (e.g., FR4), flexible printed circuits (e.g., printed circuits formed from flexible sheets of polymer such as polyimide), and rigid flex circuits (e.g., printed circuits that contain both rigid portions and flexible tails). Printed circuit boards on which components such as integrated circuit components and discrete components are mounted may sometimes be referred to as main logic boards. The electronic components and the printed circuit board may sometimes be collectively referred to as packaged components.

Printed circuit boards having shielded components may be used in electronic devices such as desktop computers, laptop computers, computers built into computer monitors, tablet computers, cellular telephones, media players, gaming devices, television set top boxes, audio-video equipment, handheld devices, miniature devices such as pendant and wristwatch devices, or other electronic equipment.

Figure 1:
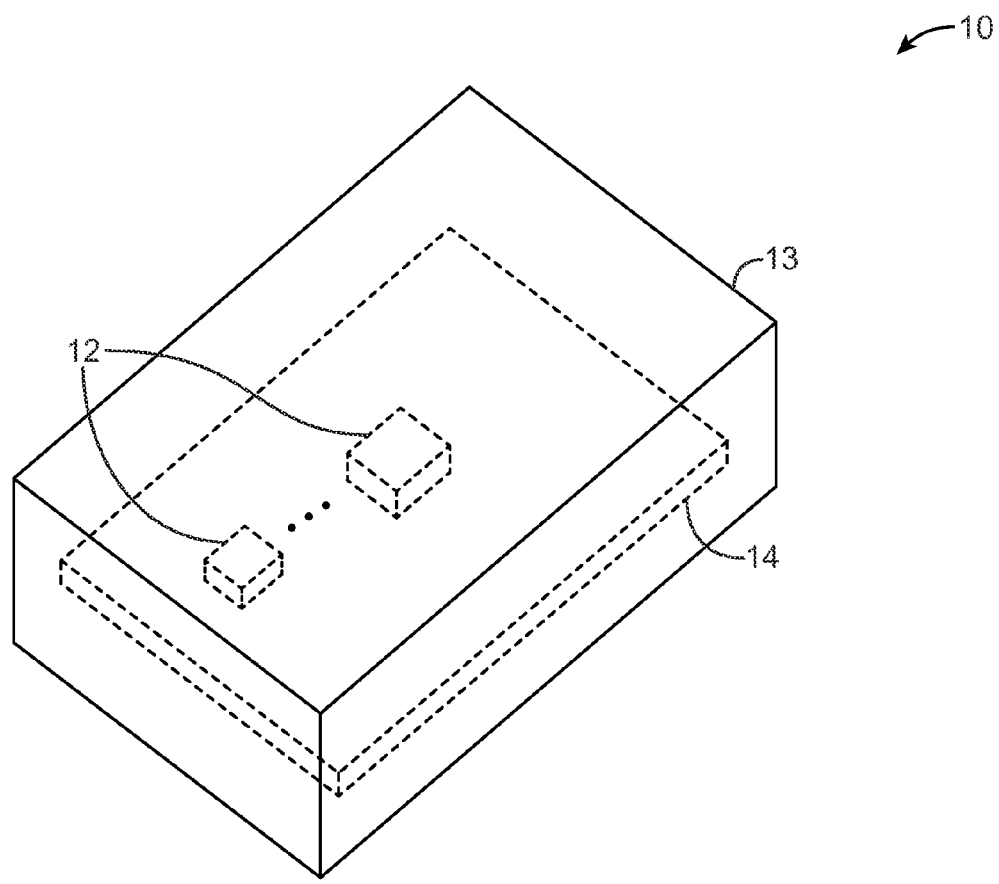
FIG. 1 is a perspective view of illustrative packaged components including a printed circuit board and components on the printed circuit board that may be shielded with electromagnetic shielding structures in accordance with an embodiment of the present invention.

An illustrative electronic device that may contain shielding structures is shown in FIG. 1. As shown in FIG. 1, electronic device 10 may include housing 13. Housing 13 may be formed from metal, plastic, fiber-composite materials such as carbon fiber materials, glass, ceramics, other materials, or combinations of these materials. Housing 13 may be formed from a single piece of machined metal (e.g., using a unibody-type construction) or may be formed from multiple structures that are attached together such as an internal housing frame, a bezel or band structure, housing sidewalls, planar housing wall members, etc.

Device 10 may include electronic components 12 mounted on a printed circuit board 14 within housing 13. Electronic components 12 may include integrated circuits such as general purpose processing units, application-specific integrated circuits, radio-frequency components such as wireless transceivers, clock generation and distribution circuits, or other electronic components such as discrete components. Printed circuit board 14 may be a main logic board (MLB) or other types of logic boards.

Figure 2:
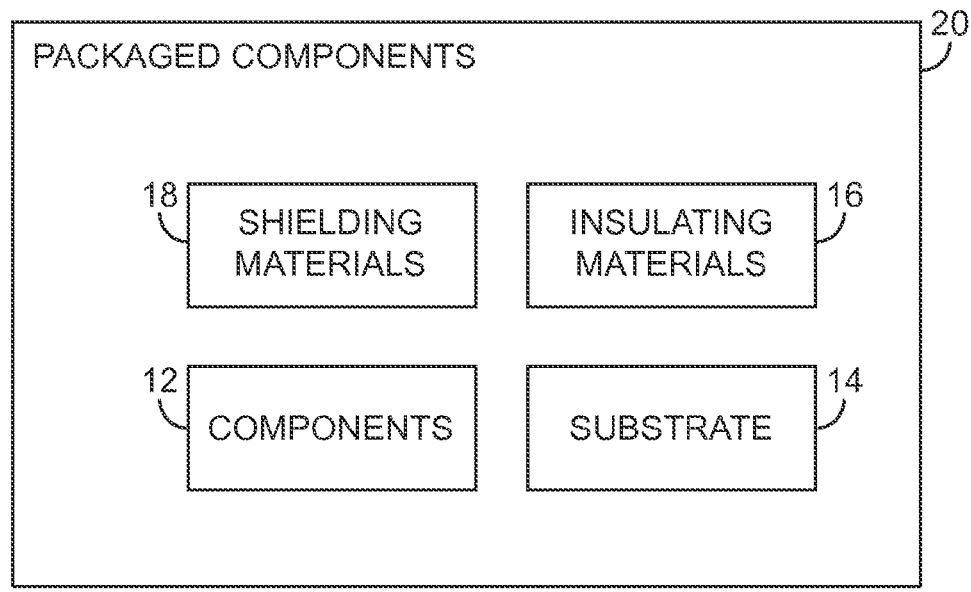
FIG. 2 is a block diagram of packaged components in accordance with an embodiment of the present invention.

Printed circuit board 14 and its associated components may sometimes be referred to herein as packaged components. FIG. 2 is an illustrative block diagram of packaged components 20 that includes components 12, substrate 14, insulating materials 16, and shielding materials 18. Components 12 may be mounted on substrate 14 (e.g., a printed circuit board) using solder or other suitable mounting arrangements.

Some of electronic components 12 may be sensitive to electromagnetic interference. For example, a wireless transceiver component may be sensitive to radio-frequency harmonics from a system clock generation component. Some of electronic components 12 may produce radio-frequency signal interference (e.g., a cellular transceiver may emit radio-frequency signals that affect other components of device 10). Other components may generate magnetic interference (e.g., inductors in a power management system may generate magnetic fields). To ensure that the components of device 10 operate properly, it may be desirable to electromagnetically shield components 12 on printed circuit board 14 from each other (e.g., by covering components 12 of FIG. 1 with shielding structures).

As an example, it may be desirable to shield a wireless communications integrated circuit to help ensure that system noise (e.g., from clocks or other noise sources) does not interfere with proper receiver operation. It may also be desirable to shield an audio circuit so that the audio circuit does not pick up noise from another circuit on device 10 or to shield memory circuits and processor components so that their clocks do not cause interference with other components. In some situations, it may be desirable to shield a group containing multiple components (e.g., when the components are sensitive to electromagnetic interference from external sources).

Shielding structures may be formed using shielding materials 18 and insulating materials 16. The shielding structures may sometimes be referred to as electromagnetic interference (EMI) shielding structures. Shielding materials 18 may include conductive materials such as silver paint, platinum paint, solder, metals such as copper or aluminum, metal alloys such as nickel-iron alloys, conductive adhesives, or other materials suitable for electromagnetic shielding. Shielding materials 18 may be formed in various configurations including walls, fences, sheets or layers, combinations of these configurations, or other desired configurations.

Insulating materials 16 may be used to help prevent electrical shorting between shielding materials 18 and conductive materials on substrate 14 (e.g., conductive portions of components 12). Insulating materials 16 may be formed from epoxy, over-molding materials, under-fill materials, heat-shrink jackets, acrylic materials, dielectric materials, thermoset materials, thermoplastics, rubbers, plastics, or other desirable materials that provide electrical insulation. Insulating materials 16 may be used to form configurations that include compartments for selected components on a substrate. If desired, insulating materials 16 may be used to form configurations that provide structural support for shielding materials 18.

Insulating materials 16 may include materials that are electrically insulating and thermally conductive. For example, insulating materials 16 may include thermally conductive plastics, epoxy, or other thermally conductive materials. Insulating materials 16 that are thermally conductive may be used to draw heat away from components 12. For example, a radio-frequency transceiver may become undesirably hot during normal operation. In this scenario, it may be desirable to form shielding structures from insulating materials that are thermally conductive to help protect the radio-frequency transceiver from overheating.

Figure 3:
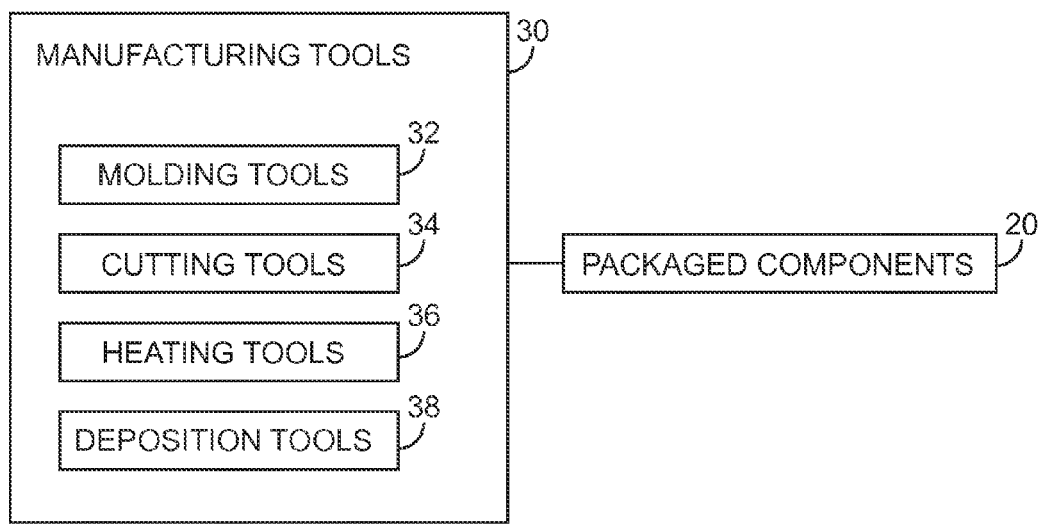
FIG. 3 is a block diagram of a manufacturing system in which manufacturing tools may be used to form shielding structures for selectively shielding packaged components in accordance with an embodiment of the present invention.

Insulating materials 16 and shielding materials 18 may be used to form shielding structures that selectively shield components 12 mounted on a substrate 14 (e.g., a printed circuit board). FIG. 3 shows manufacturing tools 30 that may be used to form shielding structures from insulating materials 16 and shielding materials 18 in packaged components 20.

Manufacturing tools 30 may include molding tools 32, cutting tools 34, heating tools 36, deposition tools 38, and other tools desirable for forming shielding structures for components 12. For example, manufacturing tools 30 may include photolithography tools for applying photoresist masks and etching tools (e.g., chemical etching tools that use etchants to remove materials). As another example, manufacturing tools 30 may include screen printing tools for printing materials such as shielding materials 18 or insulating materials 16.

Molding tools 32 may be used to mold insulating materials 16 to form shielding structures. Molding tools 32 may include injection molding tools, sintering tools, matrix molding tools, compression molding tools, transfer molding tools, extrusion molding tools, and other tools suitable for molding insulating materials 16 into a desired configuration.

Cutting tools 34 may include sawing tools, laser cutting tools, grinding tools, drilling tools, electrical discharge machining tools, or other machining or cutting tools suitable for cutting insulating materials 16 and shielding materials 18.

Heating tools 36 may include oil-based heating tools, gas-based heating tools, electrical-based heating tools, or any other heating tools suitable for heating insulating materials 16 and/or shielding materials 18. Heating tools 36 may, if desired, be used to apply pressure to materials 16 or 18.

Deposition tools 38 may be used to deposit insulating materials 16 and/or shielding materials 18. For example, deposition tools 38 may be used to form insulating structures by depositing insulating materials 16 at desired locations on substrate 14. As another example, deposition tools 38 may include tools for injecting insulating materials 16 (e.g., epoxy) into injection molding tools to form shielding structures. Deposition tools 38 may also include thin-film deposition tools (e.g., chemical or physical deposition tools) or other tools desirable for forming shielding structures.

Figure 4:
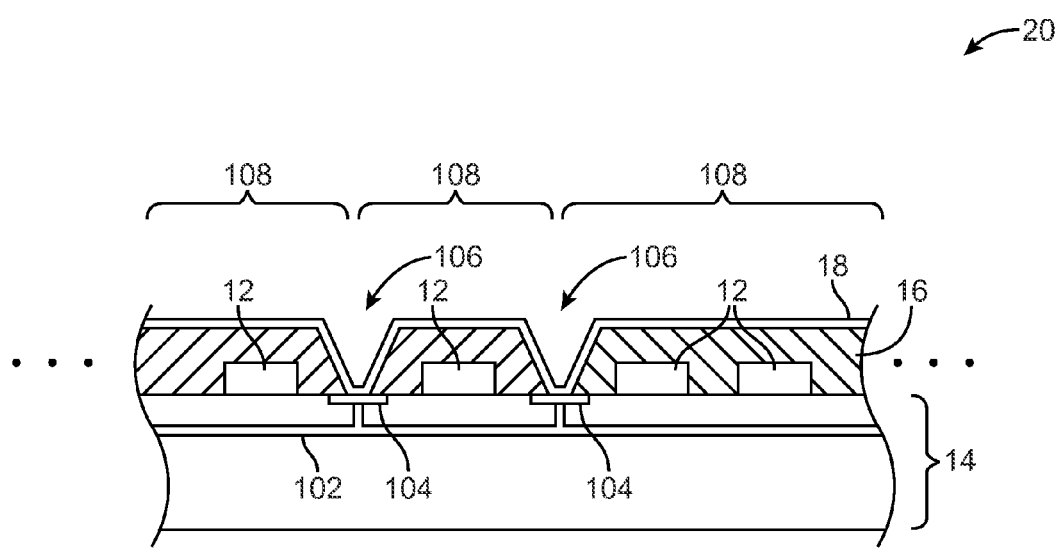
FIG. 4 is a cross-sectional view of shielding structures formed for packaged components using a laser cutting tool in accordance with an embodiment of the present invention.

Manufacturing tools 30 may be used to form shielding structures that shield respective groups of components 12 that are susceptible to electromagnetic interference. Each group of components may include one or more components 12. As shown in the illustrative arrangement of FIG. 4, compartments may be formed around selected components 12 using insulating materials 16. To form compartments from insulating materials 16, cutting tools 34 may be used to form channels 106 that separate selected components 12. Deposition tools 38 may be used to form a layer of shielding materials 18 over insulating materials 16 that helps to protect components 12 from undesired electromagnetic interference. Insulating materials 16 may provide structural support for the layer of shielding materials.

As an example, to form the shielded compartments of FIG. 4, a layer of insulating material 16 may first be formed on substrate 14 (e.g., the insulating layer may be deposited using depositing tools 38). Channels 106 may be subsequently cut through insulating layer 16 using laser cutting tools 34. Conductive traces 104 may reflect lasers emitted by laser cutting tools 34 (e.g., traces 104 may be formed from conductive materials that help protect substrate 14 from laser cutting tools 34). A conductive layer 18 such as a silver paint layer may be deposited (e.g., using depositing tools 38) over insulating layer 16 and channels 106. Conductive layer 18 may be deposited using any suitable deposition technique such as spraying, painting, etc. Conductive layer 18 may electrically couple with metal traces 104 and conductive ground plane 102 to form a conductive structure that encloses each compartment and helps protect components 12 from electromagnetic interference (e.g., electromagnetic interference from external sources or between components of different compartments).

Figure 5:
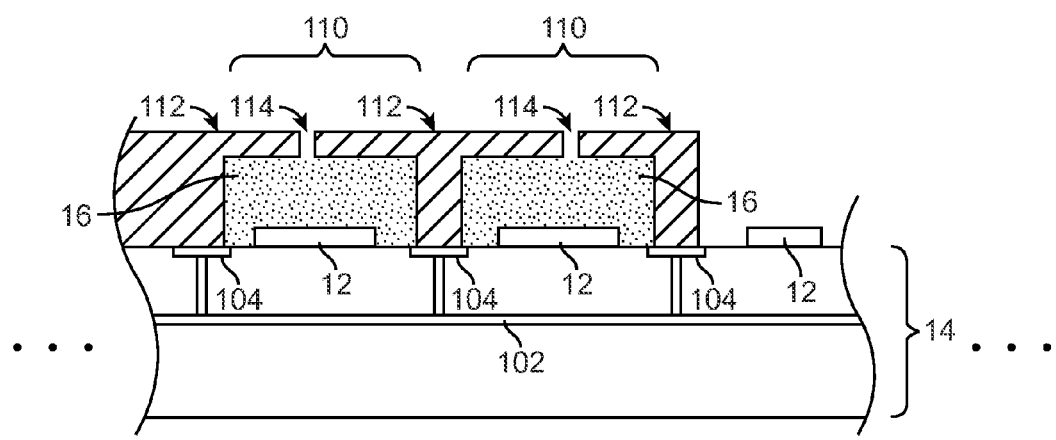
FIG. 5 is a cross-sectional view of shielding structures formed for packaged components using injection molding in accordance with an embodiment of the present invention.

FIG. 5 is an illustrative cross-sectional diagram in which compartments 110 may be formed using a molding process (e.g., an injection molding or transfer molding process). Compartments 110 may include insulating materials 16 that enclose selected components 12 (e.g., components that are sensitive to electromagnetic interference).

Molding tools such as molding tools 32 may be used to form structures 112 that define the shape and location of compartments 110. Structures 112 may be placed over conductive traces 104 that are coupled to ground plane 102. Structures 112 may have holes 114 through which insulating materials 16 may be injected into the space inside molding structures 112. After an injection process (e.g., after heated insulating materials 16 are injected and sufficiently cooled), molding structures 112 may be removed. One or more shielding layers (not shown) may be subsequently formed over insulating compartments 110 (e.g., using deposition tools 38). The shielding layer may contact traces 104 and, in combination with ground plane 102, may form a shielding structure that helps protect components in compartments 110 from electromagnetic interference.

Figure 6:
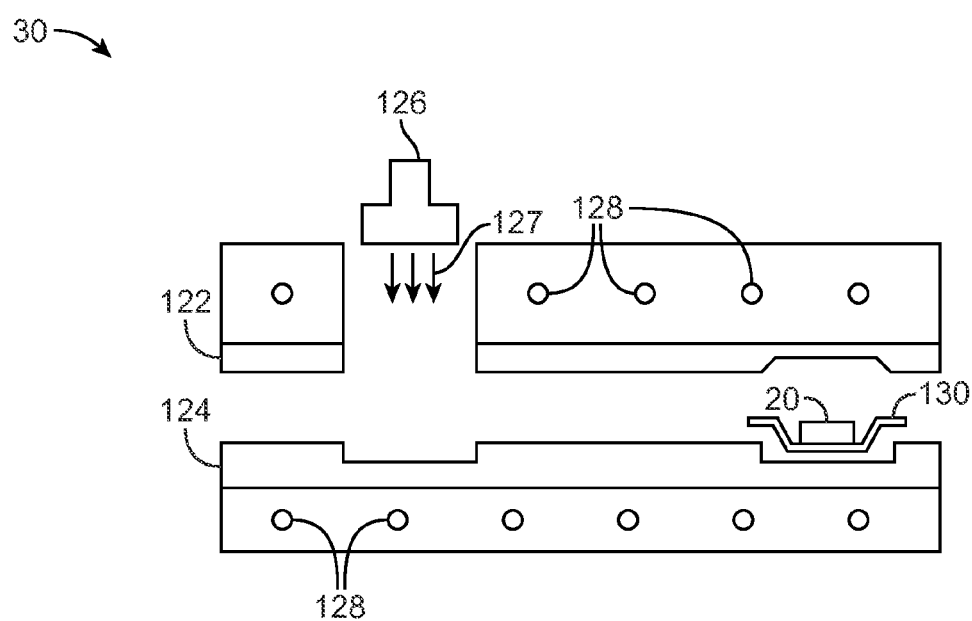
FIG. 6 is a cross-sectional view of an injection molding tool that may be used to form shielding structures for packaged components in accordance with an embodiment of the present invention.

FIG. 6 is an illustrative diagram of manufacturing tools 30 that may be used to form the shielding compartments of FIG. 5 via injection molding. As shown in FIG. 6, manufacturing tools 30 may include an upper clamp section 122 (sometimes referred to as a top chase), a lower clamp section 124 (sometimes referred to as a bottom chase), injecting tool 126 (sometimes referred to as a pot), heating elements 128, support structure 130 (sometimes referred to as a gate insert).

Packaged components 20 may be placed on component support structure 130 and injecting tool 126 may be used to inject insulating materials (e.g., thermoplastic or thermoset material) into the region between top chase 122 and bottom chase 124 as shown by arrows 127. Heating elements 128 may be used to melt the insulating materials by applying heat. Top chase 122 and bottom chase 124 may be clamped together to force insulating materials 16 to form desired compartments (e.g., compartments 110) on packaged components 20.

Figure 7A:
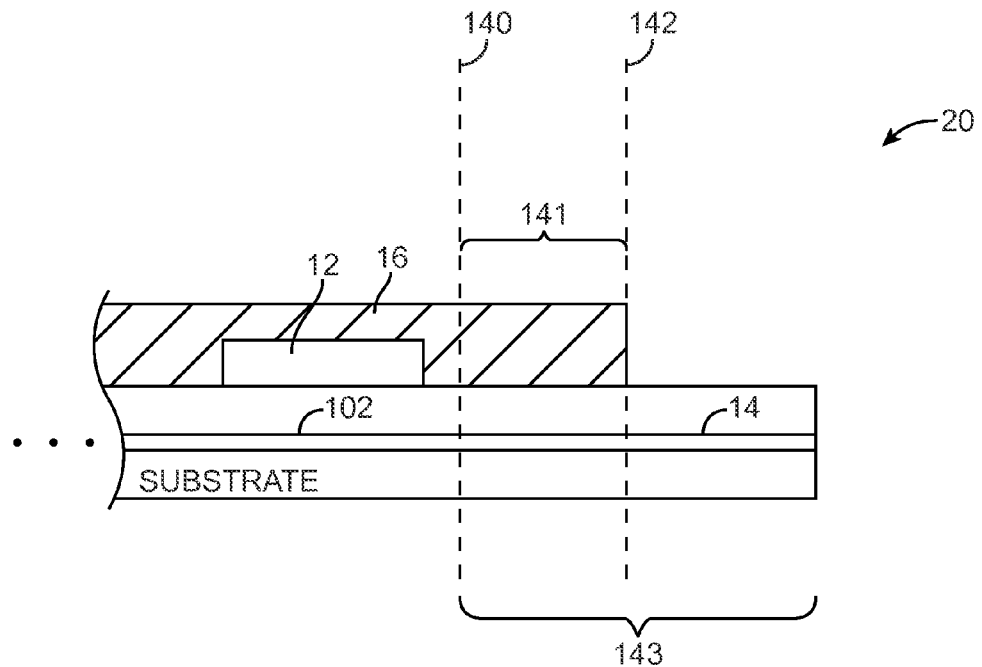
FIG. 7A is a cross-sectional view of packaged components including a substrate having sacrificial regions in accordance with an embodiment of the present invention.

Components may be placed at the edges of a substrate. In some scenarios, it may be necessary to place components at a minimum distance from the edge of the substrate. For example, a portion of the substrate at the edges of the substrate may be reserved for clamping tools that maintain stability of the substrate during manufacturing. FIG. 7A is an illustrative cross-sectional diagram of a substrate 14 having an edge region that is reserved. The edge region may be defined as the substrate region to the right of dashed line 142. Substrate 14 may include a ground plane 102.

A layer of insulating material 16 may be deposited over component 12 and substrate 14 to form shielding structures. In some scenarios, manufacturing tools such as deposition tools 38 that are used to deposit insulating layer 16 may have associated manufacturing tolerances. Consider the scenario in which it is desired to form packaged components having substrate 14 and insulating materials 16 that extend from component 12 to dashed line 140. In this scenario, it may be difficult to precisely and accurately deposit insulating material 16 due to manufacturing tolerances associated with deposition tools (e.g., insufficient insulating material or excess region 141 may be formed).

As shown in FIG. 7A, substrate 14 may be formed with an excess region 143 (e.g., a region 143 on which no components may be formed so that manufacturing variances and space reserved for clamping tools are accommodated). Excess region 143 may sometimes be referred to herein as a sacrificial region, because region 143 is not necessary to form packaged components 20 and can be removed to help reduce the overall dimensions of packaged components 20. To accommodate manufacturing tolerances, deposition tools may be configured to deposit insulating material 16 extending to dashed line 142. Dashed line 142 may be determined based on tolerance levels of the deposition tools to help ensure that deposition tools do not deposit insufficient insulating material (e.g., such as when insulating layer 16 fails to extend to dashed line 140). Excess insulating regions beyond desired boundary 140 may be removed along with the sacrificial board region 143. Sacrificial board region 143 may be removed using cutting tools 34 such as laser cutting tools or sawing tools.

Figure 7B:
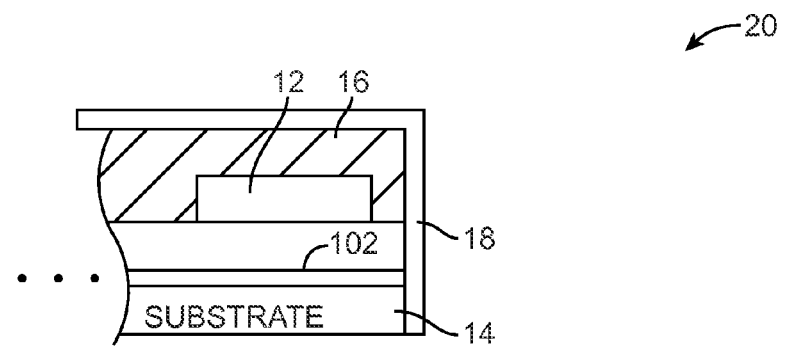
FIG. 7B is a cross-sectional view of shielding structures formed by removing sacrificial regions of a substrate in accordance with an embodiment of the present invention.

FIG. 7B is an illustrative cross-sectional diagram of packaged components 20 after removal of excess substrate 143 and insulating materials 141. A layer of shielding materials 18 may be deposited or wrapped to form a shielding structure that helps to protect component 12 that is located at the periphery of packaged components 20 from electromagnetic interference. Shielding layer 18 may extend over the edge of substrate 14 and cover the side of substrate 14 to contact ground plane 102, thereby forming enclosing component 12 in a shielding structure.

Figure 8:
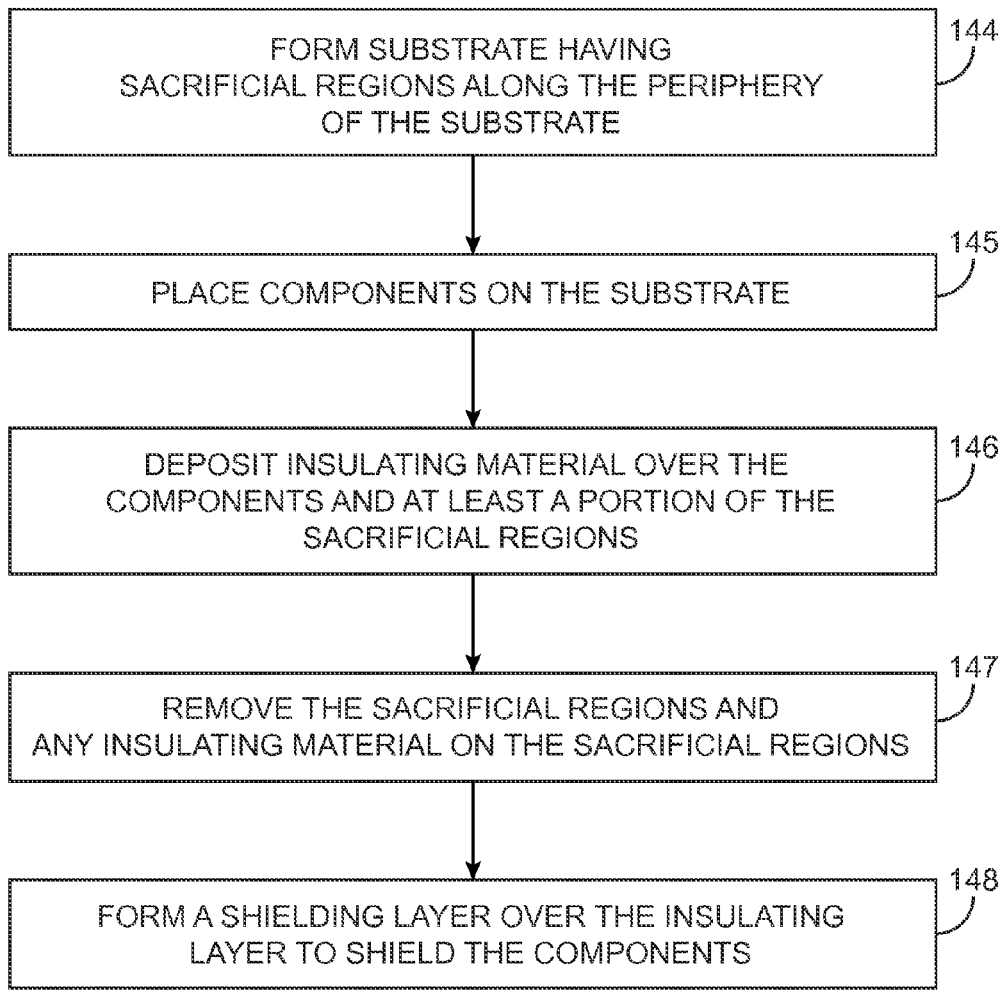
FIG. 8 is a flow chart of illustrative steps that may be performed to form shielding structures by removing sacrificial regions of a substrate in accordance with an embodiment of the present invention.

Manufacturing tools such as tools 30 may be used to form shielding structures using sacrificial regions of a substrate such as region 143 of FIG. 7A. FIG. 8 is a flowchart of illustrative steps that may be performed to form shielding structures at the periphery of a substrate (e.g., at the periphery of a main logic board). If desired, the steps of FIG. 8 may be performed in combination with steps for forming compartments for selectively shielding components on the substrate.

In step 144, a substrate having sacrificial regions along the periphery of the substrate may be formed. For example, substrate 14 may be formed with sacrificial region 143 located at the edges of substrate 14.

In step 145, components may be placed on the substrate. The components may include components mounted using surface mount technology and may include integrated circuits (e.g., integrated circuits formed on respective substrates), resistors, capacitors, inductors, or other components suitable for mounting on substrate 14. One or more of the components may be mounted adjacent to the sacrificial regions.

In step 146, deposition tools such as tools 38 may be used to deposit insulating material over the substrate. The deposition tools may be configured to deposit the insulating material in a layer that sufficiently extends into sacrificial regions of the substrate (e.g., to accommodate variances of the boundary of the layer of insulating material). The insulating layer may be formed to enclose the components. If desired, the insulating layer may be formed having compartments such as compartment 108 of FIG. 4 or compartment 110 of FIG. 5 (e.g., using cutting tools such as laser tools or using molding tools).

In step 147, the sacrificial regions of the substrate may be removed. The sacrificial regions may be removed using cutting tools 34. For example, laser cutting tools may be used to cut through insulating materials 16 and substrate 14 along dashed line 140 of FIG. 7A to remove sacrificial region 143. By removing the sacrificial regions, an edge of the substrate may be exposed (e.g., a side wall of the substrate may be exposed).

In step 148, a shielding layer may be formed over the insulating layer to shield the underlying components from electromagnetic interference. The shielding layer may be deposited using deposition tools 38. As an example, shielding layer 18 may be formed from conductive materials deposited on the top and side of insulating layer 16 as shown in FIG. 7B. In this scenario, the conductive materials may extend to cover exposed portions of substrate (e.g., a side wall of substrate 14 exposed by the removal of sacrificial regions).

Figure 9:
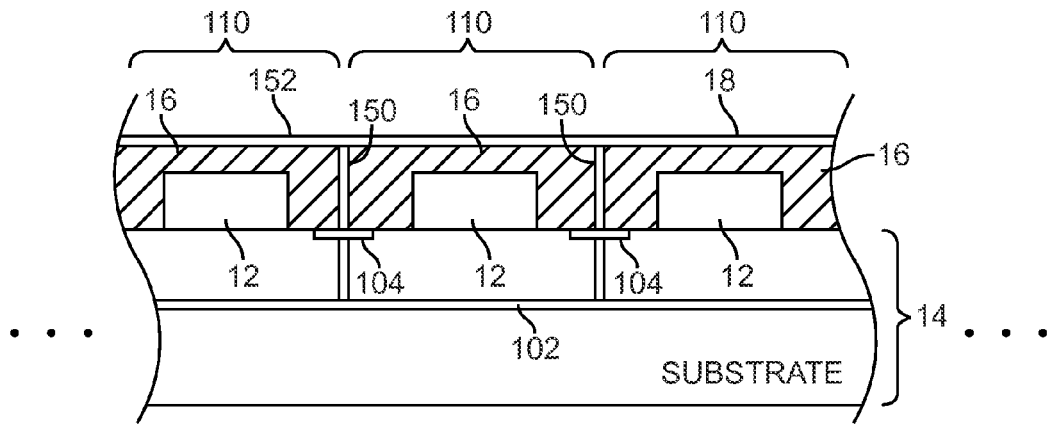
FIG. 9 is a cross-sectional view of packaged components having shielding structures formed using conductive walls in accordance with an embodiment of the present invention.

Shielding compartments for components may be formed using conductive walls. The conductive walls may be formed between components 12 (e.g., walls may be formed between components 12 that are sensitive to radio-frequency interference or produce electromagnetic interference). In the example of FIG. 9, compartments may be formed by separating components 12 with conductive walls 150 (e.g., walls formed from solder, metals, metal alloys, or other conductive materials) that are electrically coupled to conductive traces 104 and conductive ground plane 102. Insulating materials 16 (e.g., over-molding materials) may be subsequently deposited to enclose components 12 and a conductive layer 152 (e.g., silver paint) may then be deposited over insulating materials 16 and conductive walls 150.

Figure 10:
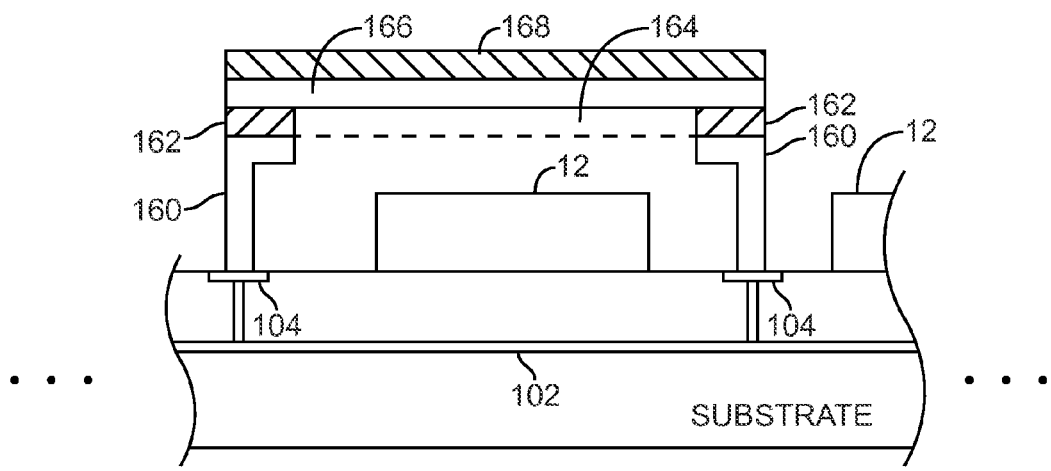
FIG. 10 is a cross-sectional view of packaged components having shielding structures formed using conductive fences in accordance with an embodiment of the present invention.

Shielding compartments may be formed by depositing conductive fences around selected components 12. In the example of FIG. 10, conductive fences 160 may be formed on conductive traces 104 to surround a given component 12 (e.g., without surrounding component 12 that is to the right of the shielded component). Traces 104 may be electrically coupled to ground plane 102 (e.g., through conductive vias formed in substrate 14). Conductive fences 160 may extend into the page to isolate components 12 from each other. Conductive fences 160 may partially or completely surround selected components that require electromagnetic shielding. A conductive layer 166 (e.g., a metal foil, conductive plate, etc.) may be attached over fences 160 using conductive adhesive 162 (e.g., a conductive adhesive layer formed from anisotropic conductive film or paste). Conductive layer 166 may serve as a radio-frequency shielding layer.

If desired, optional insulating layer 164 may be formed underneath conductive layer 166 (e.g., insulating layer 164 may be attached to the bottom surface of conductive layer 166). Insulating layer 164 may help ensure that components 12 are not electrically shorted to conductive layer 166.

In one suitable embodiment, a magnetic shielding layer 168 may be formed (e.g., deposited) over radio-frequency shielding layer 166. Magnetic shielding layer 168 may be formed from materials that help to redirect magnetic fields away from component 12. Shielding layer 168 may, as an example, be formed from metal alloys such as nickel-iron alloys that tend to absorb magnetic fields.

The example of FIG. 10 in which magnetic shielding layer 168 is formed over radio-frequency shielding layer 166 is merely illustrative. In another suitable embodiment, radio-frequency shielding layer 166 may be formed over magnetic shielding layer 168 (e.g., the two layers may be interchanged). If desired, only one of shielding layers 166 and 168 may be formed. For example, in scenarios in which only magnetic shielding is desired, radio-frequency shielding layer 166 may be omitted. Alternatively, if only radio-frequency shielding is desired, magnetic shielding layer 168 may be omitted.

Figure 11A:
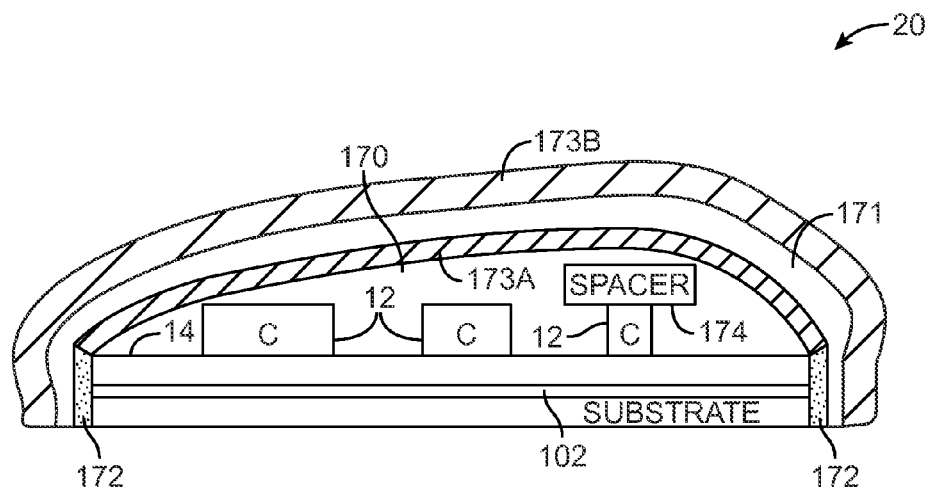
FIG. 11A is a cross-sectional view of packaged components having shielding structures formed from wrapped foil in accordance with an embodiment of the present invention.

A shielding structure for components may be formed by wrapping a shielding layer around packaged components. FIG. 11A is an illustrative cross-sectional diagram in which a shielding layer 171 may be wrapped around components 12 on a substrate 14. As shown in FIG. 11A, shielding layer 171 may be coupled to side walls of substrate 14 via solder joints 172 that are electrically coupled to ground plane 102. Components 12 may be placed on substrate 14.

A shielding structure formed from insulating layers 173A and 173B and shielding layer 171 may be wrapped over components 12 and substrate 14. Shielding layer 171 may be interposed between insulating layers 173A and 173B. Shielding layer 171 may be formed from a radio-frequency shielding layer, a magnetic shielding layer, or both (e.g., a radio-frequency shielding layer formed over a magnetic shielding layer). As an example, shielding layer 171 may be formed from a flexible conductive foil such as a metal foil (e.g., copper foil, aluminum foil, etc.).

Shielding layer 171 and insulating layers 173A and 173B may be wrapped separately over components 12 and substrate 14 or may be formed a wrap structure that is wrapped over components 12 and substrate 14. As an example, shielding layer 171 may be attached to insulating layers 173A and 173B via adhesives to form a single wrap structure.

Insulating layers 173A and 173B may serve to electrically isolate shielding layer 171 (e.g., from components 12 or external objects). Shielding layer 171 may be electrically coupled to ground plane 102 via solder joints 172 to form a shielding structure that encloses components 12. The example of FIG. 11A in which shielding layer 171 is coupled to ground plane 102 via solder joints 172 is merely illustrative. If desired, shielding layer 171 may be coupled to ground plane 102 via solder or conductive adhesives such as anisotropic conductive adhesives (e.g., conductive film or paste). The shielding structure may include ground plane 102 and shielding layer 171.

In some scenarios, it may be desirable to maintain a minimum distance between components 12 and shielding layer 171. For example, the presence of a shielding layer such as layer 171 near some of components 12 may affect operation of those components. Spacers such as spacer block 174 may be interposed between components 12 and shielding layer 171 to ensure that a sufficient distance is maintained between components 12 and shielding layer 171 so that the presence of shielding layer 171 does not interfere with normal operation of components 12. Spacers 174 may be formed from insulating materials (e.g., insulating materials 16) and may be formed having any desired shape and dimensions. Shielding layer 171 and insulating layers 173A and 173B may be structurally supported by components 12 and/or spacers 174.

If desired, region 170 between shielding layer 171 and substrate 14 may be filled with insulating materials. The insulating materials may be used in combination with or in place of insulating layer 173A. As an example, the insulating materials may include over-molding or under-fill materials (e.g., materials associated with injection molding). The insulating materials may serve to insulate components 12 from shielding layer 171 and may be used in place of or in addition to insulating layer 173A. The insulating materials may serve as a structural support for shielding layer 171. In one suitable embodiment, the insulating materials may include thermally conductive materials that conduct heat away from components 12 (e.g., the insulating materials may be electrically insulating and thermally conductive).

Figure 11B:
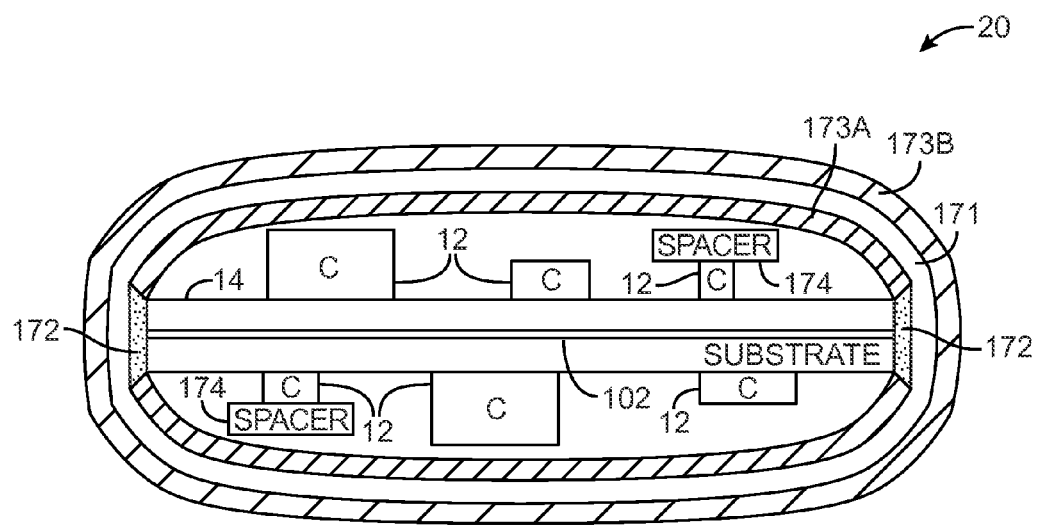
FIG. 11B is a cross-sectional view of packaged components having shielding structures formed from wrapped foil that shields components formed on opposing surfaces of a substrate in accordance with an embodiment of the present invention.

In some scenarios, components may be placed on opposing surfaces of a substrate. FIG. 11B is an illustrative cross-sectional diagram in which components 12 are formed on top and bottom opposing surfaces of substrate 14. In the example of FIG. 11B, a shielding structure formed from layers 171, 173A, and 173B may be wrapped around components 12 and the top and bottom surfaces of substrate 14 so that the shielding structure forms a first compartment that shields the components on the top surface of substrate 14 and a second compartment that shields the components on the bottom surface of substrate 14. If desired, spacers 174 may be used to help ensure sufficient distance between components 12 and the shielding structure.

Figure 11C:
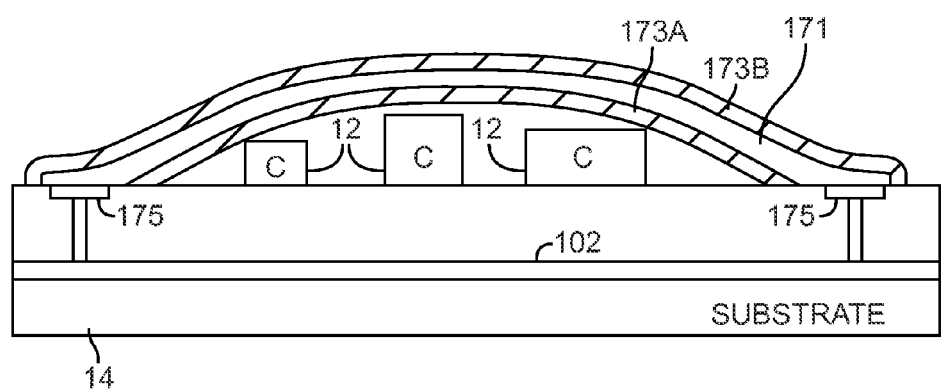
FIG. 11C is a cross-sectional view of packaged components having shielding structures formed using wrapped foil on a single surface of a substrate in accordance with an embodiment of the present invention.

It is not necessary to wrap the shielding structure of FIG. 11A around the sides of substrate 14. FIG. 11C is an illustrative cross-sectional diagram in which a shielding structure may be formed that includes shielding layer 171, contacts 175, and ground plane 102. Contacts 175 may be formed on the surface of substrate 14. Contacts 175 may be formed from metal traces or other conductive materials. For example, metal traces may be deposited on substrate 14. In this scenario, some of the metal traces may form contacts for components, whereas other metal traces may form contacts 175. Shielding layer 171 may be coupled to contacts 175 via solder or conductive adhesive (not shown). Contacts 175 may be coupled through substrate 14 to ground plane 102 so that components 12 are enclosed by shielding layer 171 and ground plane 14.

Figure 12:
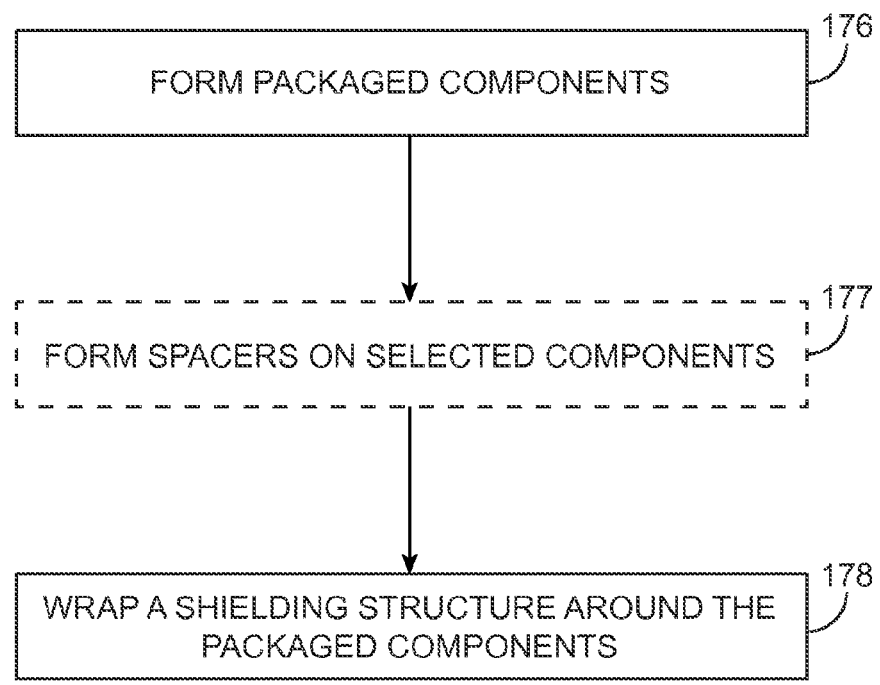
FIG. 12 is a flow chart of illustrative steps that may be performed to form shielding structures on a substrate using wrapped foil in accordance with an embodiment of the present invention.

FIG. 12 is a flow chart of illustrative steps that may be performed using manufacturing tools such as tools 30 to form a wrapped shielding structure that shields components on a substrate (e.g., from magnetic and/or radio-frequency interference).

In step 176, packaged components may be formed. The packaged components may include components placed on a substrate (e.g., integrated circuit components formed on respective substrates or discrete components such as resistors, capacitors, etc.). The components may be placed on a single surface of the substrate or on opposing surfaces of the substrate. The substrate may include a ground plane that serves as an electrical grounding path for the components on the substrate. If desired, the substrate may be formed with contacts such as contacts 175 that are coupled to the ground plane through the substrate.

In step 177, spacers may be formed on selected components. For example, spacers 174 may be placed on components as shown in FIGS. 11A and 11B. The spacers may be formed to help ensure sufficient spacing between selected components and a shielding structure formed during step 178.

In step 178, a shielding structure may be wrapped around the packaged components so that the components on the substrate are shielded from radio-frequency and/or magnetic interference. As an example, the shielding structure may be a metal foil that is wrapped around the packaged components and coupled to side walls of the substrate via solder or conductive adhesives (e.g., as shown in FIG. 11A or FIG. 11B). As another example, the shielding structure may be coupled to contacts on the surface of the substrate via solder or conductive adhesives (e.g., as shown in FIG. 11C).

Figure 13A:
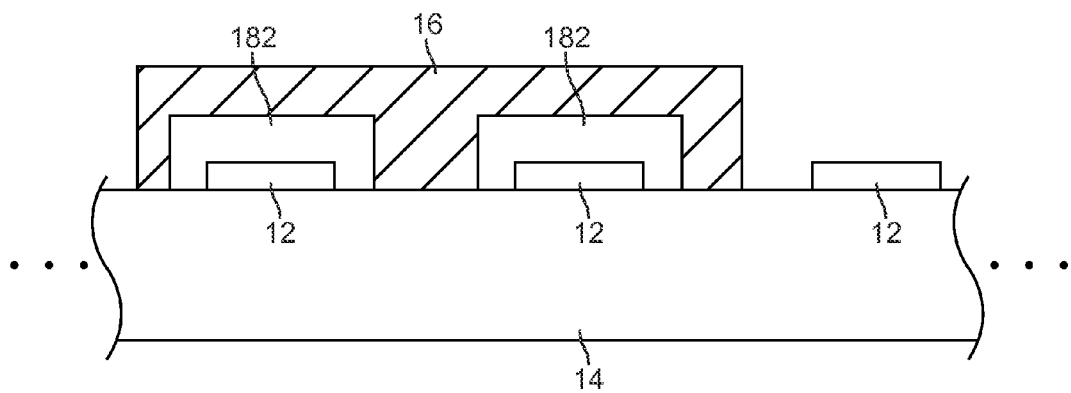
FIGS. 13A and 13B are cross-sectional views showing illustrative steps involved in forming a shielding structure by applying heat and/or pressure to an insulating structure in accordance with an embodiment of the present invention.

Insulating structures for components 12 may be formed before attaching insulating structures to packaged components 20. As shown in FIG. 13A, insulating materials 16 may be pre-formed and then placed on substrate 14 over components 12. As an example, pre-mold materials may be heated and partially cured in a desired shape that forms compartments around components 20. As another example, heat-shrink material formed from polymeric heat-shrink materials (e.g., heat-shrink materials formed from polymers) may be used to form compartments around components 20. Examples of heat-shrink materials include nylon, polyvinyl chloride (PVC), rubber, or other thermoplastic materials.

Figure 13B:
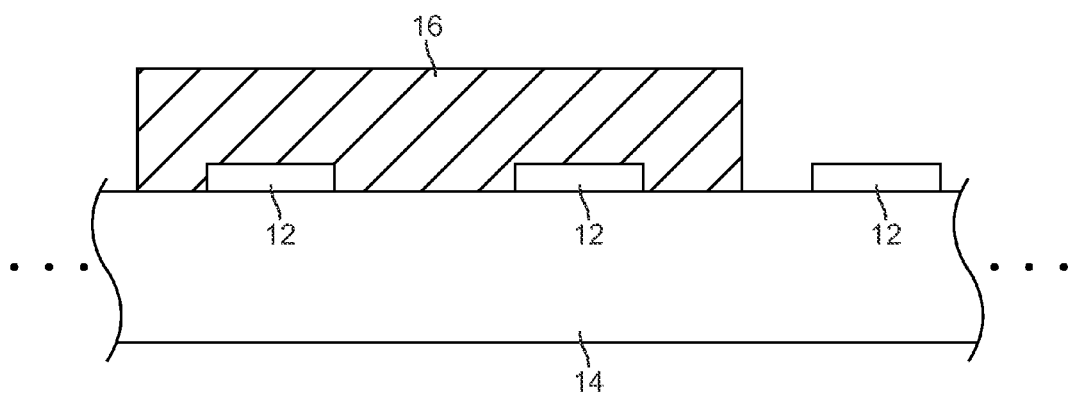

The insulating materials may be formed having compartments that are somewhat larger than what is necessary to enclose components 12. In other words, gaps 182 may separate insulating materials 16 and components 12. As shown in FIG. 13B, insulating materials 16 may be reformed to fill gaps 182 (e.g., by applying heat and/or pressure to reform portions of insulating materials 16). A shielding layer (not shown) may be subsequently formed over insulating materials 16 to shield components 12 from electromagnetic interference. For example, a metal foil may be wrapped around insulating materials 16 or a metallic paint may be deposited over insulating materials 16.

In one suitable embodiment, compartments may be formed around selected components without covering other components. In the example of FIG. 13B, an insulating structure may be formed that covers first and second components while leaving a third component exposed. In this scenario, the first and second components may be electromagnetically shielded without shielding the third component (e.g., by depositing a layer of conductive material over the insulating structure without depositing conductive material over the exposed component).

Figure 14:
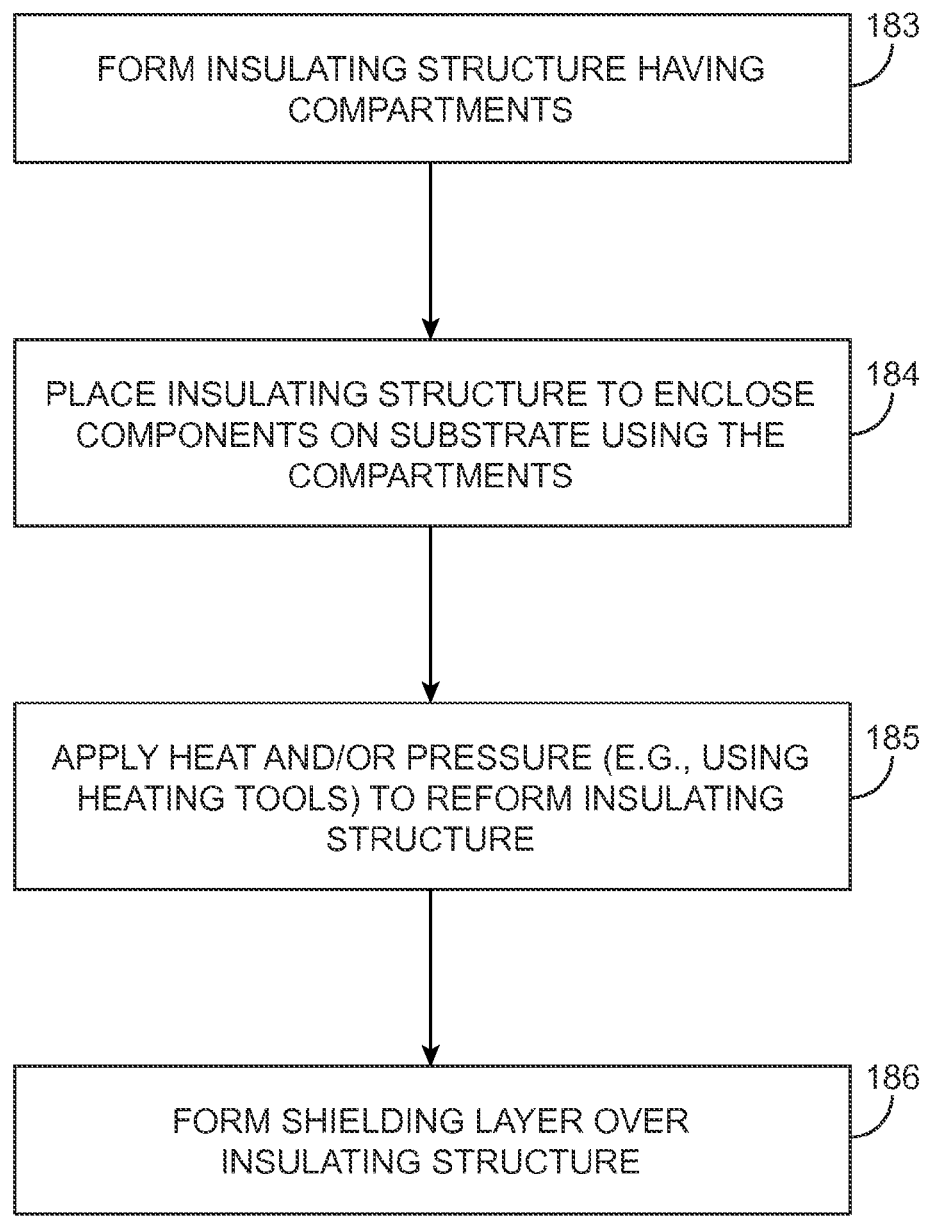
FIG. 14 is a flow chart of illustrative steps that may be performed to form a shielding structure by applying heat and/or pressure to an insulating structure in accordance with an embodiment of the present invention.

FIG. 14 is a flowchart of illustrative steps that may be performed using manufacturing tools to shield components on a substrate by reforming an insulating structure.

In step 183, an insulating structure having compartments may be formed from insulating materials (e.g., using molding tools 32 or other manufacturing tools). The insulating materials may be formed from materials that can be reformed via heat and/or pressure (e.g., thermoplastic materials). The compartments may be formed based on the location and dimensions of components on a substrate. Each compartment may be formed somewhat larger than a corresponding component that is to be enclosed by that compartment.

In step 184, the insulating structure may be placed on the substrate so that the components on the substrate are enclosed by corresponding compartments (e.g., as shown in FIG. 13A).

In step 185, heat and/or pressure may be applied to the insulating structure so that the insulating structure is reformed to fill gaps between the compartment walls and the components (e.g., as shown in FIG. 13B). For example, heating tools 36 may be used to apply heat to the insulating structure. In one suitable embodiment, the insulating structure may be formed from a heat-shrink material that shrinks to fit the components in response to being heated. The heat-shrink material may be reconfigured via heating into a heat-shrunk material having reduced dimensions.

In step 186, a shielding layer may be formed over the insulating structure to shield the components from electromagnetic interference (e.g., radio-frequency and/or magnetic interference). The shielding layer may be formed using deposition tools 38, by wrapping the substrate with a shielding structure, etc.

During manufacturing, it may be desirable to test components such as radio-frequency components before the components have been permanently covered with shielding structures. For example, it may be desirable to perform tests on integrated circuits that have been soldered to a printed circuit board before the components are covered with insulating and shielding materials. By testing the components before the process of fabricating the shielding structures is complete, the ability to rework or scrap defective components may be preserved.

Figure 15:
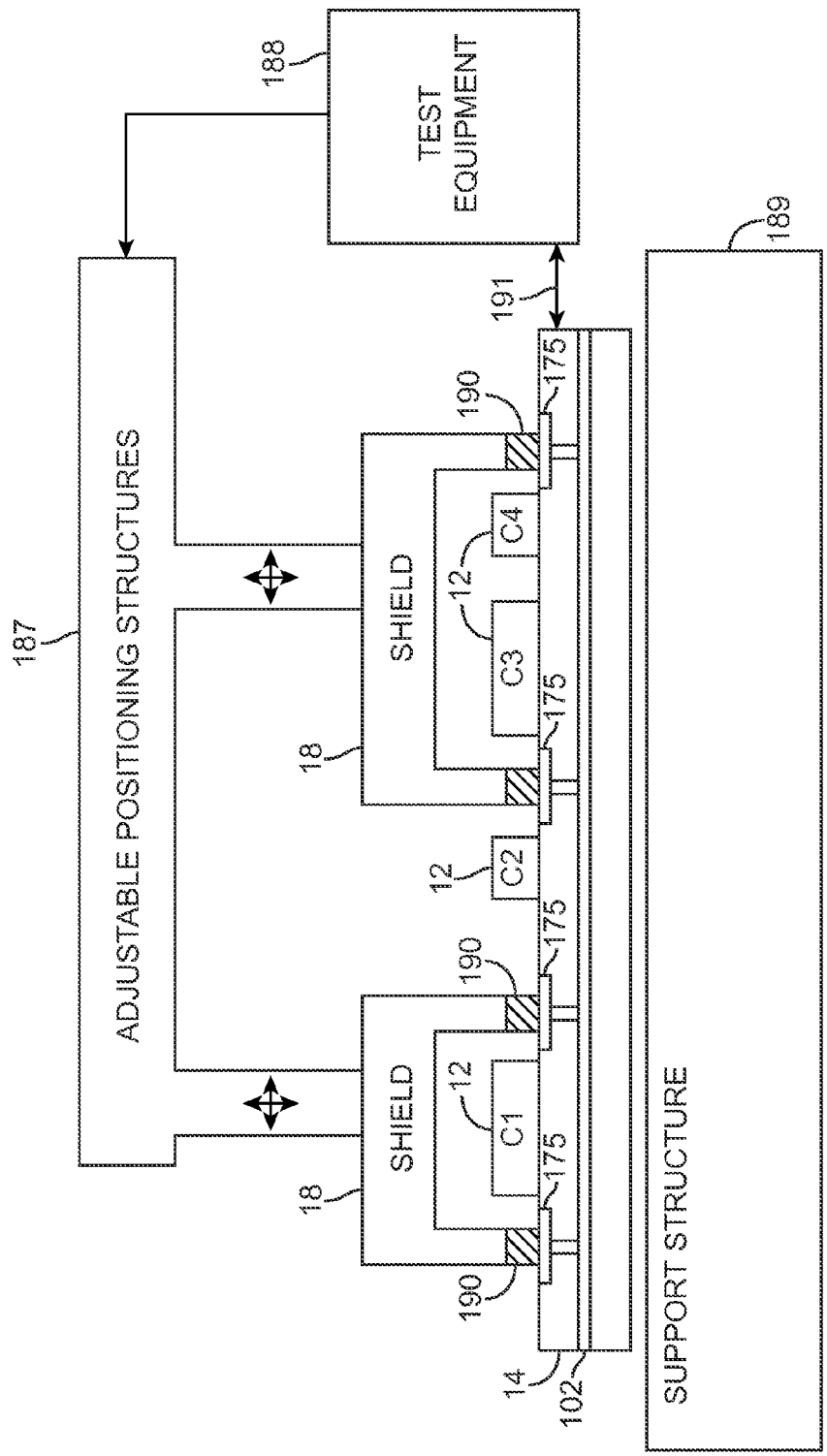
FIG. 15 is an illustrative diagram of a test system in which temporary shields may be used to shield components during testing in accordance with an embodiment of the present invention.

As shown in FIG. 15, substrate 14 may be placed on a support structure 189 for testing of components 12. Support structure 189 may serve to hold substrate 14 in a stable position during testing. For example, support structure 189 may include clamps for holding substrate 14 in place during testing. Temporary shields 18 (e.g., formed from electromagnetic shielding materials) may be placed over components 12 that require testing using adjustable positioning structures 187. For example, adjustable positioning structures 187 may include motors and/or actuators that can be controlled to adjust the position of temporary shields 18 in three dimensional space. Adjustable positioning structures 187 may be controlled using test equipment (e.g., computing equipment). If desired, an insulating layer (not shown) formed from an easily removable insulating material may be interposed between temporary shields 18 and components 12 and may help prevent electrical shorting between temporary shield 18 and components 12.

Temporary shields 18 may include compressible members 190 formed from compressible materials such as steel wool, conductive polymers, or other conductive and compressible materials. Substrate 14 may include contacts 175 to which compressible members 190 may be coupled during testing. Compressible members 190 may help protect contacts 175 from being damaged during testing. During testing, a shielding structure formed from temporary shields 18, contacts 175, and ground plane 102 may help protect selected components 12 on substrate 14 from electromagnetic interference.

During testing, test equipment 188 (e.g., a tester) may be used to communicate with components 12 via paths 191. Paths 191 may include cables and probes for conveying test signals between test equipment 188 and components 12. For example, probes may be used to contact test points at the surface of substrate 14. In this scenario, the substrate may include paths that couple the test points to components 12 to convey the test signals between the test points and the components.

Test equipment 188 may perform testing on components by sending and receiving test signals from components 12 via paths 191. Testing may be performed to determine whether components 12 are operating properly. Adjustable positioning structures may be used to adjust the positioning of shields 18 to shield selected components from electromagnetic interference during test operations. For example, during a first test operation, components C1, C3, and C4 may be shielded. During subsequent test operations, adjustable positioning structures may be used to reposition shields 18 to shield other components such as component C2.

Figure 16:
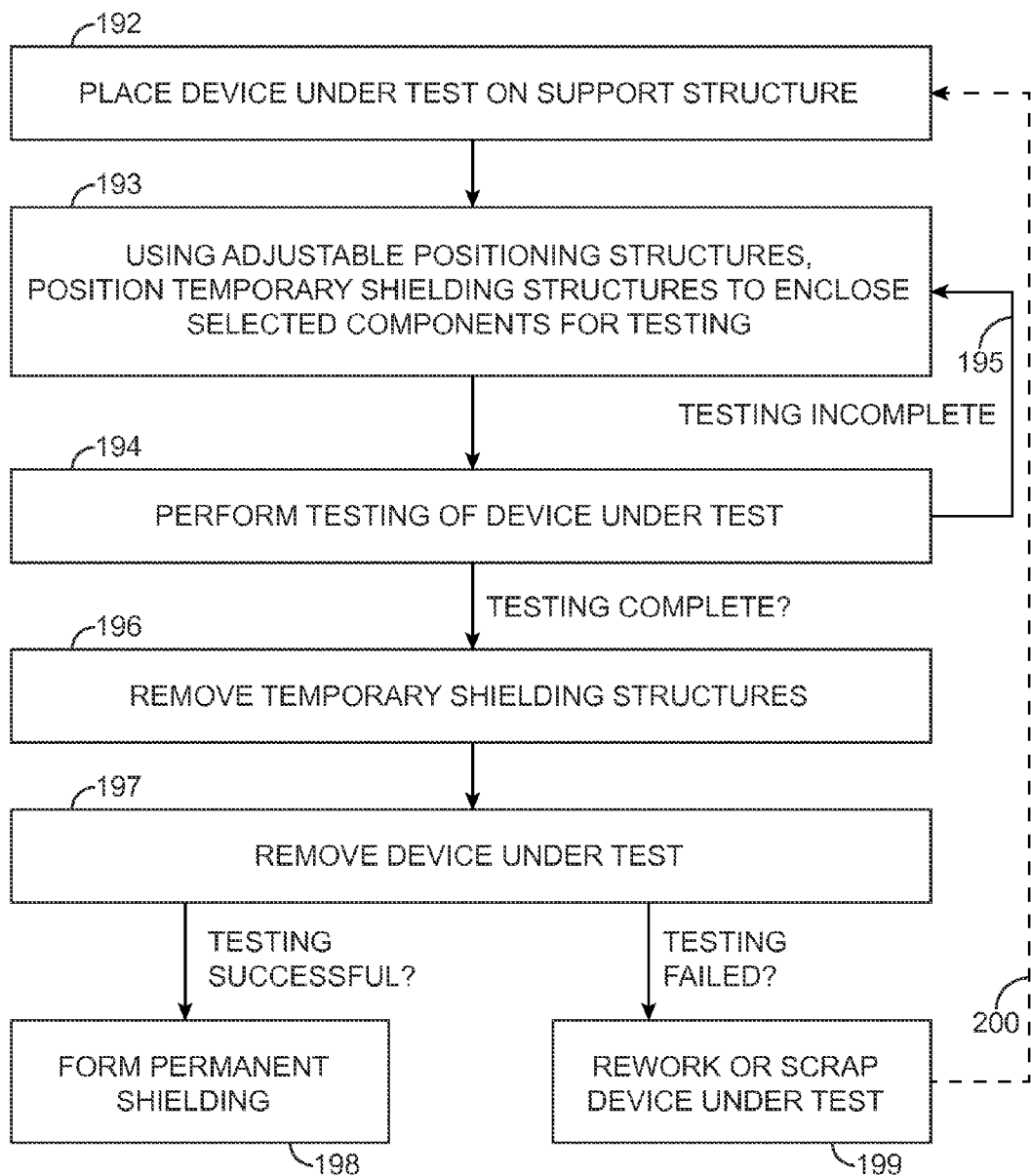
FIG. 16 is a flow chart of illustrative steps involved in using temporary shields to shield components during testing in accordance with an embodiment of the present invention.

FIG. 16 is a flow chart of illustrative steps that may be performed to temporarily shield components on a substrate.

In step 192, a device under test (e.g., a substrate 14 on which components 12 have been placed) may be placed on support structure such as support structure 189.

In step 193, adjustable positioning structures may be used to position temporary shielding structures to enclose selected components on the device under test. For example, adjustable positioning structures 187 of FIG. 15 may be used to adjust the positioning of temporary shields 18 so that compressible members 190 are coupled to contacts 175 of substrate 14.

In step 194, test equipment such as test equipment 188 may be used to perform testing of the device under test. For example, test equipment 188 may be used to test components to determine whether the device under test is operating properly (e.g., to determine whether components 12 on substrate 14 are operating properly). During testing, the temporary shielding structures may serve as radio-frequency and/or magnetic shielding for selected components of the device under test. If desired, the temporary shielding structures may be configured to shield all of the components or selected groups of the components.

Subsequent tests that require different configurations of the temporary shielding structures may be performed by returning to step 193 via path 195. For example, temporary shielding structures may be repositioned to shield different components during subsequent tests. If testing is complete, the operations of step 196 may be performed.

In step 196, the temporary shielding structures may be removed from the device under test. For example, adjustable positioning structures 187 may be used to reposition temporary shields 18 away from components 12.

In step 197, the device under test may be removed from the support structure. If testing was successful, the operations of step 198 may be performed to form permanent shielding structures that serve as radio-frequency and/or magnetic shielding for components on the device under test. In the event that testing fails (e.g., if one or more components of the device under test are identified as defective), the operations of step 199 may be performed.

In step 199, the device under test may be reworked or scrapped. As an example, the device under test may be reworked to replace defective components or rework routing paths or connections on the substrate (e.g., by re-soldering connections between the components and the substrate). In this scenario, the process may return to step 192 via optional path 200 to test the reworked device under test.

It may be desirable to test components on a substrate during the formation of shielding structures for the components (e.g., to test for faults in the components or the connections between the components and the substrate during the formation of permanent shielding structures). FIGS. 17A-17H are illustrative diagrams of steps that may be performed to form shielding structures for packaged components 20 and to test components during the formation of the shielding structures.

Figure 17A:
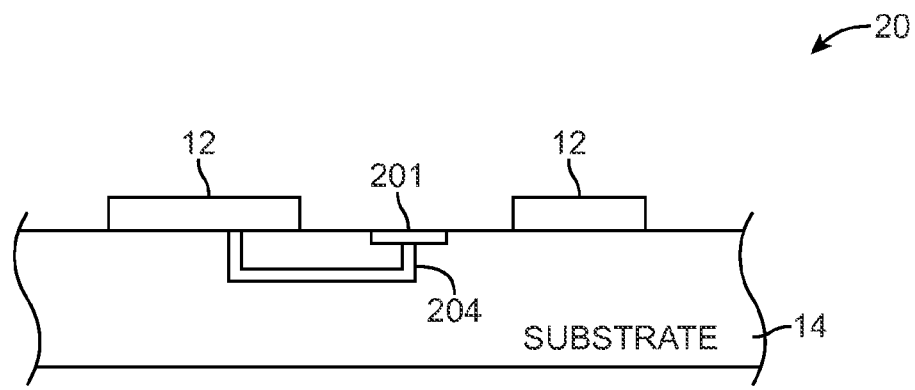
FIG. 17A-17H are cross-sectional side views showing illustrative steps involved in forming packaged components having test points and testing the packaged components using the test points in accordance with an embodiment of the present invention.

As shown in FIG. 17A, packaged components 20 may include components 12 placed on a substrate 14. Test point 201 may be formed on substrate 14 (e.g., by depositing copper or other conductive materials using tools such as deposition tools 38 to form a contact). Test point 201 may be electrically coupled to a respective component 12 via path 204 in substrate 14.

Figure 17B:
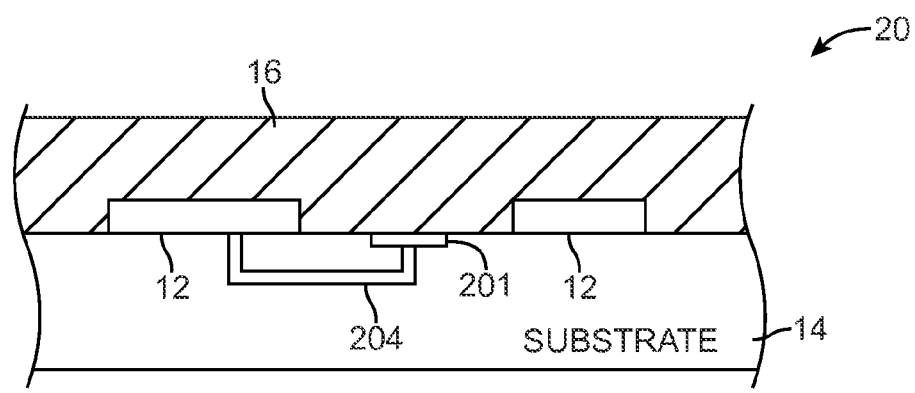

An insulating layer 16 may be deposited to cover components 12, test point 201, and substrate 14 as shown in FIG. 17B. Insulating layer 16 may include any desired insulating materials (e.g., as described in connection with FIG. 2). Tools such as deposition tools 38 or molding tools 32 may be used to form insulating layer 16.

Figure 17C:
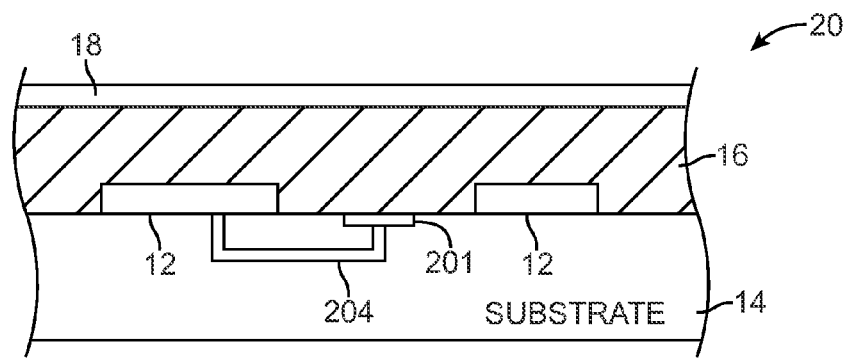

In a subsequent step, a layer of conductive materials 18 may be deposited over insulating layer 16 as shown in FIG. 17C. Conductive layer 18 may be deposited using deposition tools 38.

Figure 17D:
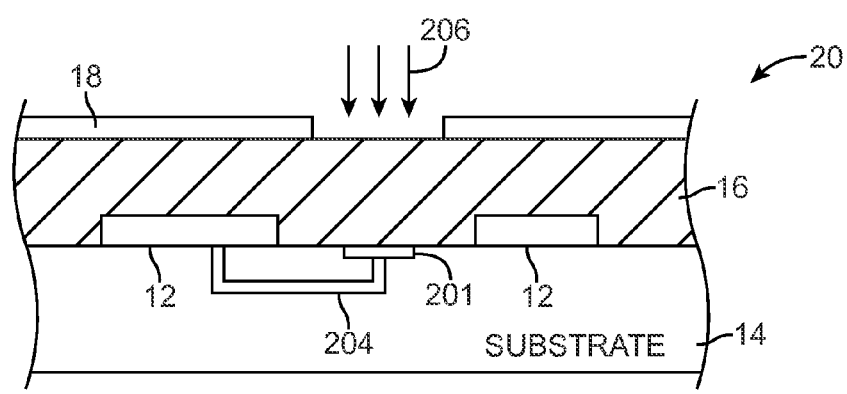

A portion of conductive layer 18 over test point 201 may then be removed as shown by arrows 206 of FIG. 17D. The portion of conductive layer 18 that is removed may be somewhat larger in area than the area of underlying test point 201.

The portion of conductive layer 18 may be removed using tools such as cutting tools 34. For example, a laser cutting tool may be used to remove the portion of conductive layer 18. As another example, an etching tool may be used to remove the portion of conductive layer 18 via etching.

Figure 17E:
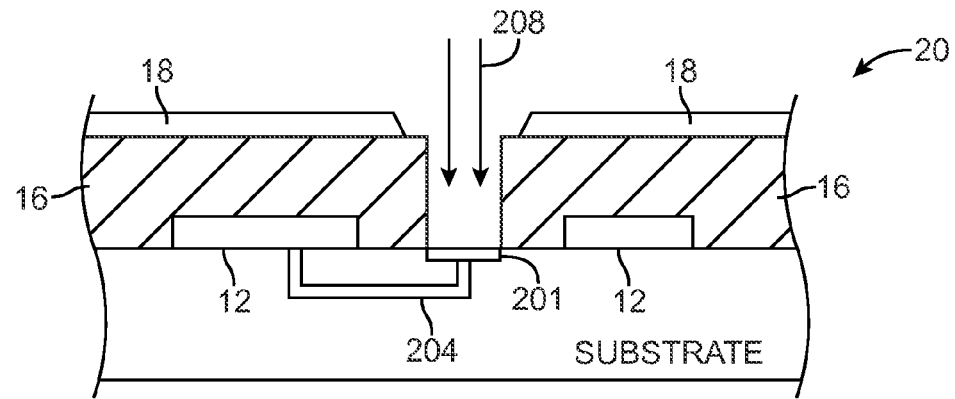

As shown by FIG. 17E, a portion of insulating layer 16 may be removed to expose test point 201 as shown by arrows 208. The portion of insulating layer 16 may be removed via laser cutting, etching, drilling, etc.

Figure 17F:
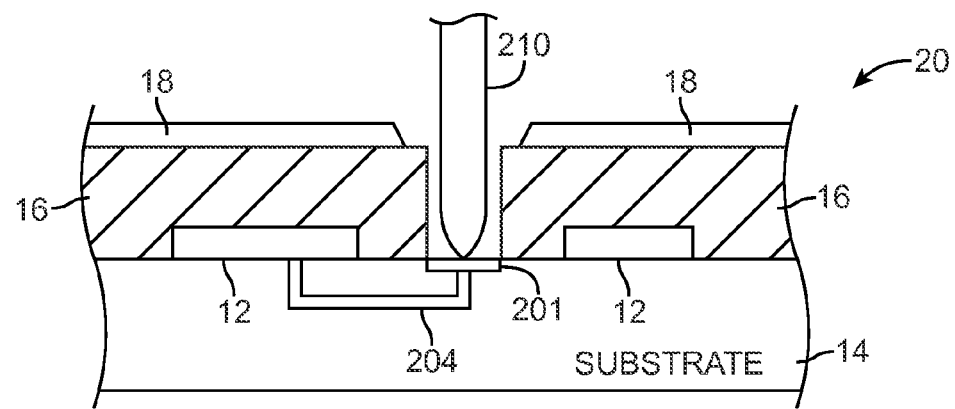

In a subsequent step, testing of packaged components 20 may be performed using a test probe 210 as shown in FIG. 17F. Test probe 210 may be positioned to contact test point 201. By removing a portion of conductive layer 18 that is somewhat larger than the area of test point 201 (e.g., as shown in FIG. 17D), test probes may be inserted to contact test point 201 without electrically shorting to conductive layer 18. Test probe 210 may be used to transmit and receive test signals from component 12 via test point 201 and path 204. Test equipment (not shown) may be coupled to test probe 210 and may process the test signals.

The example of FIG. 17F in which a component 12 is tested using a single test point 201 is merely illustrative. In one suitable embodiment, a single component may be coupled to multiple test points via respective paths 204 (e.g., each test point may be used to receive and transmit different test signals for the component). In this scenario, one or more test probes may be used to test the component using the test points. In another suitable embodiment, multiple components 12 may be coupled to different test points 201. In this scenario, the components may be tested separately or in parallel (e.g., using multiple test probes to send and receive test signals to the components via respective test points 201). In the event that one or more components fail testing, the device may be scrapped.

Figure 17G:
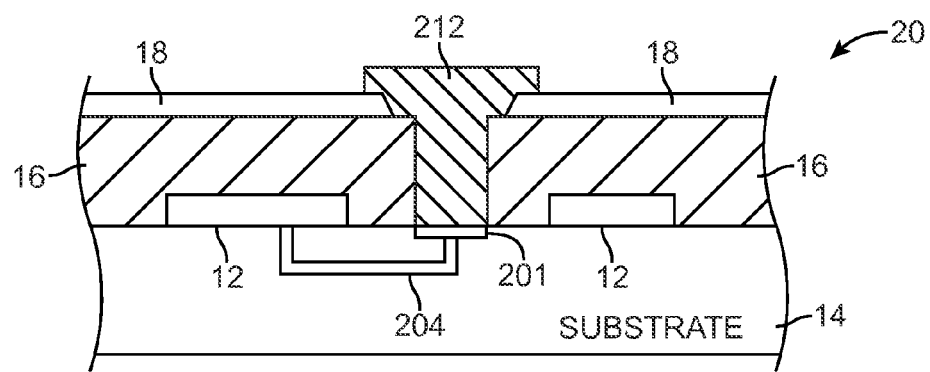
Figure 17H:
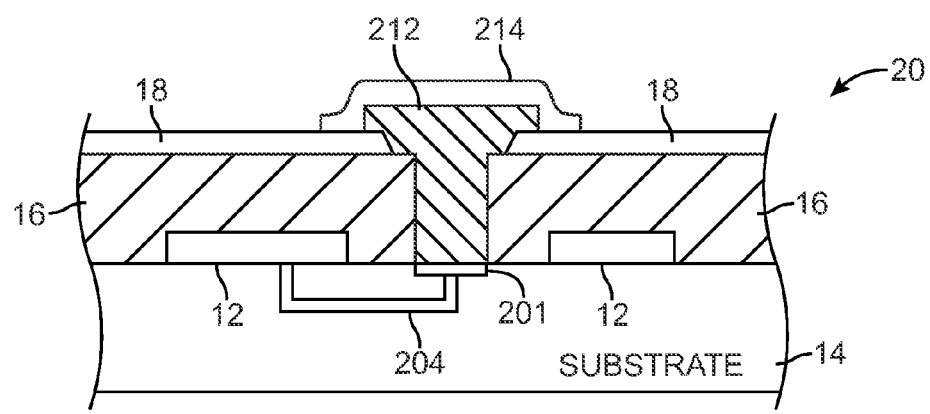

After testing of packaged components 20 is complete (e.g., in response to determining that components 20 are operating properly), the previously removed regions of conductive layer 18 and insulating layer 16 may be filled with an insulating material 212 as shown in FIG. 17H. Insulating material 212 may include any desired insulating material such as those used to form insulating layer 16 and may be deposited using depositing tools 38.

As shown in FIG. 17H, a conductive layer 214 may be deposited over insulating material 212. Conductive layer 214 may be coupled to conductive layer 18 that surrounds test point 201. Conductive layer 214 may serve as an electromagnetic shield for test point 201. For example, during normal operation, components 12 may radiate radio-frequency signals from test point 201. The radiated radio-frequency signals may be blocked by conductive layer 214. Insulating materials 212 may serve to isolate layer 214 from test point 201 (e.g., so that test point 201 is not electrically shorted to conductive layer 214).

As an example, test point 201 may be a substantially circular contact formed on the surface of substrate 14. In this scenario, insulating material 212 may form a cylindrical insulating structure that covers test point 201. If desired, insulating material 212 may overlap with insulating layer 16 and/or conductive layer 18. Conductive layer 214 may be deposited to cover a substantially circular area over test point 201 and insulating material 212. Conductive layer 214 and conductive layer 18 may, in combination, serve to form a continuous layer of conductive material over components 12.

The example of FIG. 17H in which layers 18 and 214 are formed from a conductive material is merely illustrative. If desired, layers 18 and 212 may be formed from any desired radio-frequency and/or magnetic shielding materials for shielding components 12 from interference.

Figure 18:
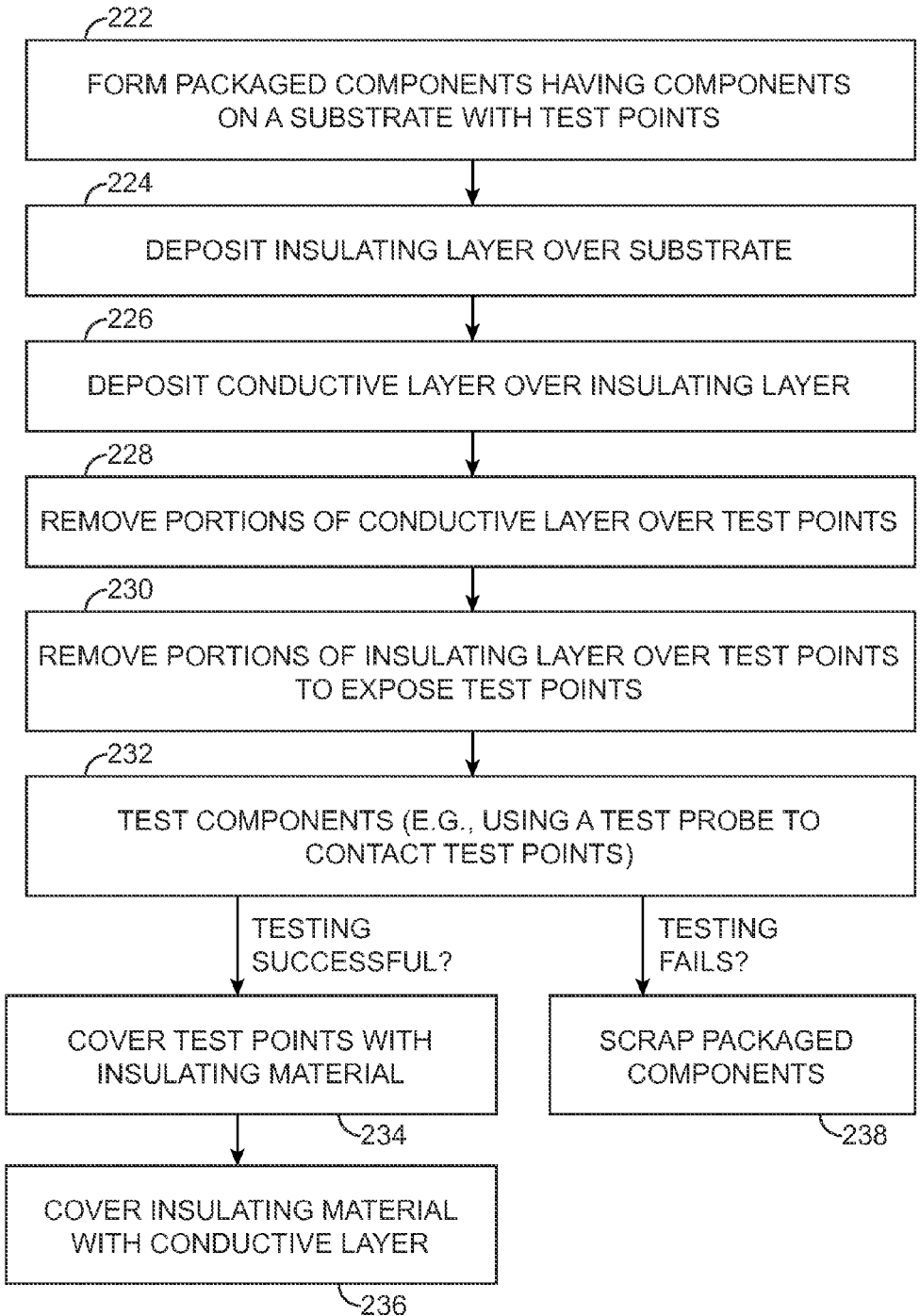
FIG. 18 is a flow chart of illustrative steps involved in forming packaged components having test points and testing the packaged components using the test points in accordance with an embodiment of the present invention.

FIG. 18 is a flow chart of illustrative steps that may be performed to test components on a substrate during the formation of shielding structures for components on a substrate.

In step 222, packaged components may be formed having components on a substrate. The substrate may include test points that are coupled to the components (e.g., as shown in FIG. 17A).

In step 224, an insulating layer may be deposited on the substrate (e.g., insulating layer 16 of FIG. 17B). The insulating layer may be formed from any desired insulating materials and may be deposited using deposition tools 38.

In step 226, a conductive layer may be deposited over the substrate (e.g., conductive layer 18 of FIG. 17C). The conductive layer may be formed by depositing conductive materials using deposition tools 38.

In step 228, portions of the conductive layer over the test points may be removed to expose underlying portions of insulating layer 16 (e.g., using etching tools or cutting tools 34 such as laser cutting tools).

In step 230, portions of insulating layer 16 that were exposed during step 228 may be removed so that the test points are exposed (e.g., using cutting tools 34).

In step 232, the exposed test points may be used to test components that are coupled to the test points. For example, test equipment may be used to send and receive test signals to the components using probes that contact the test points (e.g., as shown in FIG. 17F). In response to successful completion of testing, the operations of step 234 may be performed. In response to identifying failures during testing, the device may be scrapped during step 238.

In step 234, the test points may be covered with insulating material. For example, deposition tools 38 may be used to fill regions of insulating layer 16 and conductive region 18 that were removed during steps 226 and 228 with an insulating material 212 (e.g., as shown in FIG. 17G).

In step 236, the insulating material over the test points may be covered with a layer of conductive materials for shielding the test points (e.g., as shown in FIG. 17H). The layer of conductive materials may be deposited using deposition tools 38 to form substantially circular patches that cover the test points.

In one suitable embodiment, packaged components may be formed with test posts for testing of components. FIGS. 19A-19F are illustrative diagrams of steps that may be performed to form packaged components having test posts and to test the packaged components using the test posts.

Figure 19A:
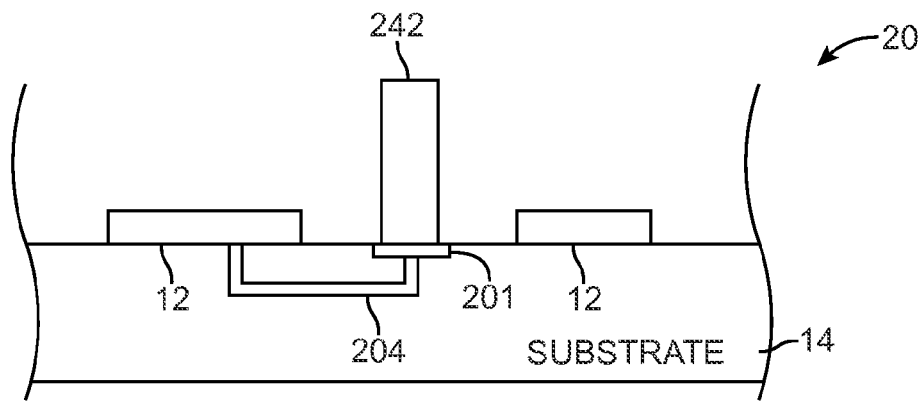
FIGS. 19A-19F are cross-sectional side views showing illustrative steps involved in forming packaged components having test posts and testing the packaged components using the test posts in accordance with an embodiment of the present invention.

As shown in FIG. 19A, packaged components 20 may be formed with components 12 and test post 242 on a substrate 14. Substrate 14 may include test point 201 (e.g., a contact formed from copper or other conductive materials) that is coupled to a respective component 12 via path 204. Test post 242 may be formed from a conductive material and may be coupled to test point 201. Test post 242 may be coupled to test point 201 via solder or conductive adhesives (not shown). Test post 242 may be substantially cylindrical or any other desired shape.

Figure 19B:
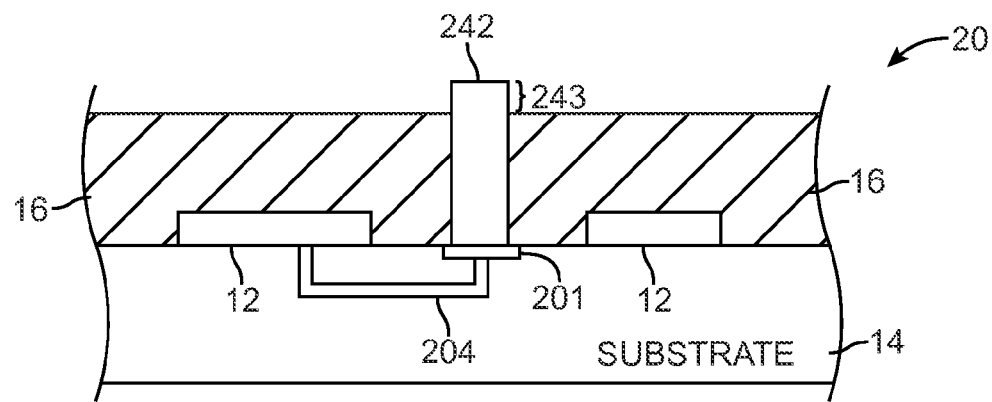

In a subsequent step, a layer of insulating material 16 may be deposited on substrate 14 as shown in FIG. 19B. Insulating layer 16 may surround test post 242 without covering test post 242. In other words, tip portion 243 of test post 242 may remain exposed.

Figure 19C:
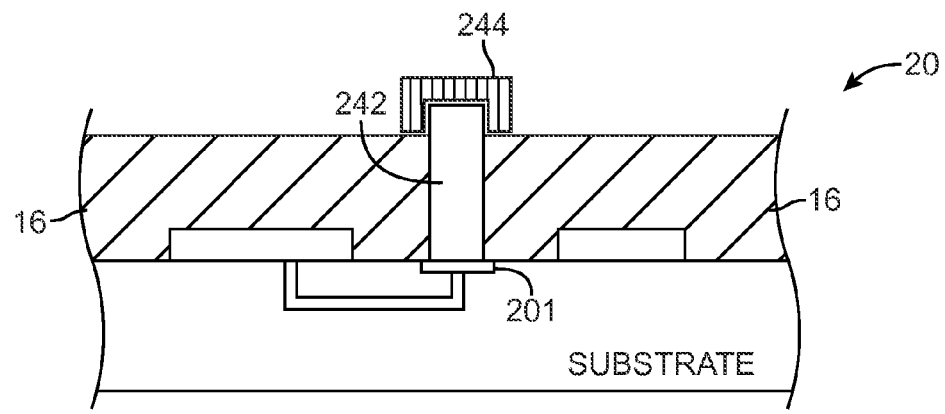

A removable cap 244 may then be placed over test post 242 as shown in FIG. 19C. Removable cap 244 may be formed in the shape of the exposed area of test post 242 (e.g., substantially circular from a top-down perspective). Removable cap 244 may contact insulating layer 16 so that removable cap 244 encloses the exposed portion of test post 242. Removable cap 244 may be formed from any desired materials (e.g., insulating materials).

Figure 19D:
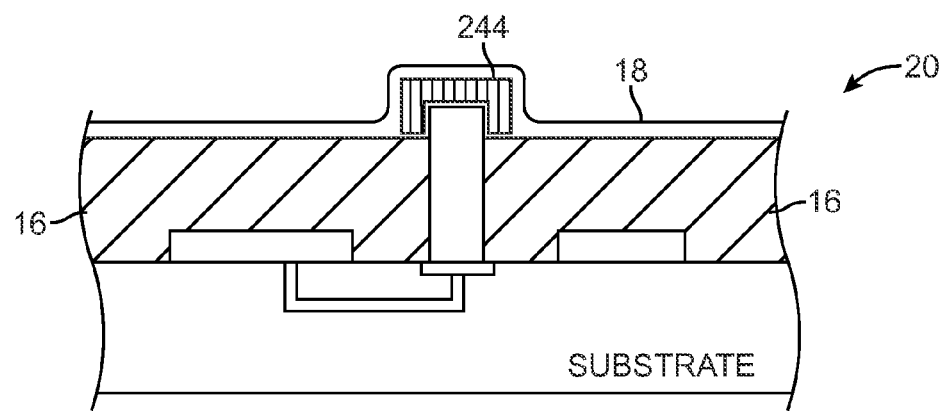

A layer of conductive material 18 may then be deposited over insulating layer 18 and removable cap 244 as shown in FIG. 19D (e.g., using deposition tools 38).

Figure 19E:
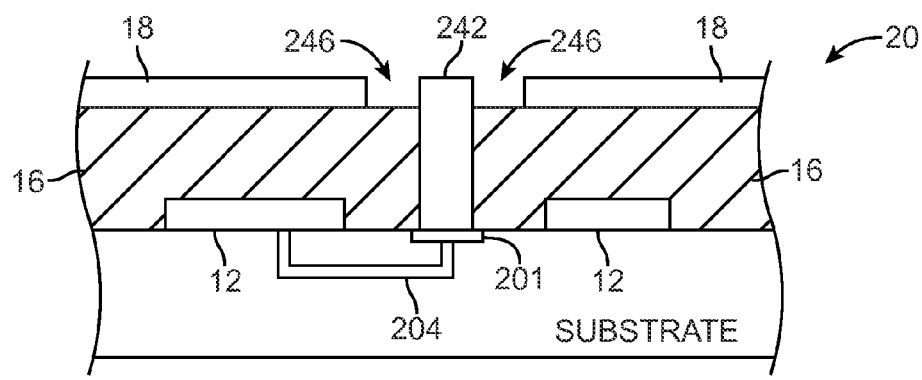

Removable cap 244 may be subsequently removed along with portions of conductive layer 18 that covers removable cap 244 as shown in FIG. 19E. Regions 246 of insulating layer 16 may be exposed by the removal of cap 244. The use of removable cap 244 may help ensure sufficient separation between conductive test post 242 and conductive layer 18 so that test post 242 is not electrically shorted to conductive layer 18.

Test post 242 may be used to perform testing of a respective component 12 that is coupled to test post 242 via contact 201 and path 204. For example, a probe may be positioned to contact test post 242 and used to transmit and receive test signals through test post 242 to the respective component 12. If desired, multiple test posts that are coupled to components on substrate 14 may be formed and used for testing of the components.

Figure 19F:
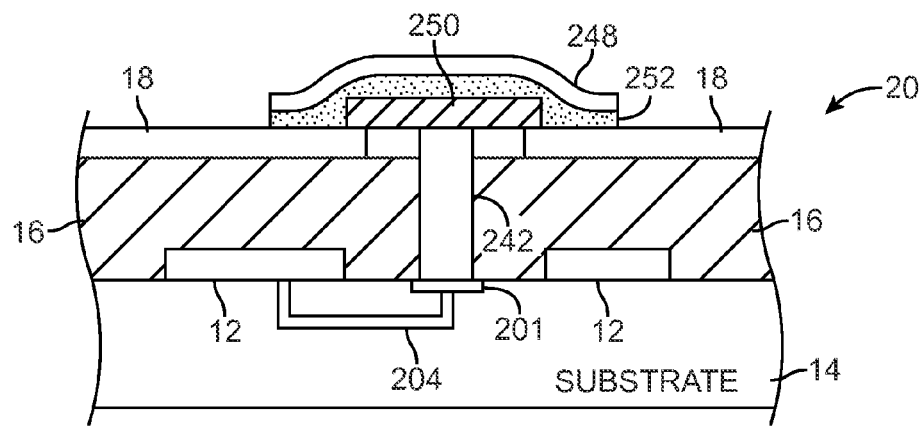

In a subsequent step, a shielding structure may be formed that shields test post 242 as shown in FIG. 19F. The shielding structure may include an insulating layer 250 that overlaps test post 242 and neighboring regions of conductive layer 18. A conductive layer 248 that overlaps insulating layer 250 may be coupled to regions of conductive layer 18 that are adjacent to insulating layer 250. Conductive layer 248 may be coupled to insulating layers 250 and conductive layer 18 via a layer 252 formed from a conductive adhesive material such as anisotropic conductive adhesives. Conductive layer 248 may be formed from any desired shielding material such as shielding material 18.

Figure 20:
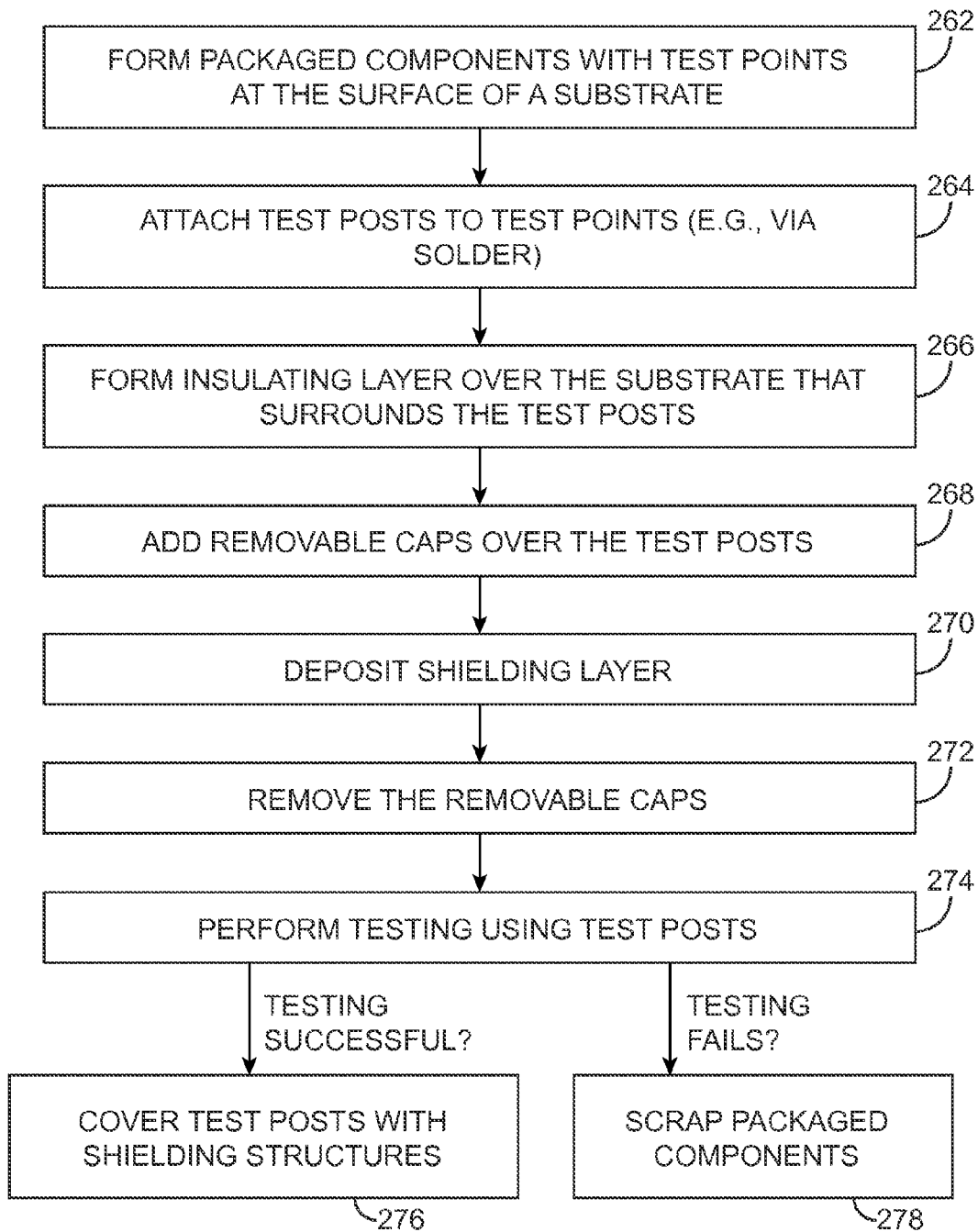
FIG. 20 is a flow chart of illustrative steps involved in forming packaged components having test posts and testing the packaged components using the test posts in accordance with an embodiment of the present invention.

FIG. 20 is a flow chart of illustrative steps that may be performed to form packaged components having test posts and using the test posts to test the packaged components.

In step 262, the packaged components may be formed having test points at the surface of a substrate (e.g., test points such as test point 201 of FIG. 19A). The test points may be coupled to components on the substrate.

In step 264, test posts may be attached to the test points (e.g., test posts such as test post 242 of FIG. 19A that are coupled to components). The test posts may extend vertically above the substrate and may be attached to the test points via solder or other forms of conductive coupling (e.g., conductive adhesive, etc.).

In step 266, a layer of insulating material may be formed over the substrate (e.g., insulating layer 16 of FIG. 19B). The insulating layer may surround the test posts without covering the test posts.

In step 268, removable caps may be placed over the test posts. Each removable cap may, for example, be formed and placed over a respective test post as shown in FIG. 19C.

In step 270, a shielding layer may be deposited using deposition tools 38 as shown in FIG. 19D. The shielding layer may be deposited over the substrate and the removable caps. The shielding layer may include one or more layers of radio-frequency shielding materials and/or magnetic shielding materials.

In step 272, the removable caps may be removed along with portions of the shielding layer that cover the removable caps (e.g., as shown in FIG. 19E). Portions of insulating layer 16 that are adjacent to each test post may be exposed by the removal of the caps.

In step 274, testing of components may be performed using the test posts (e.g., using test equipment to transmit and receive test signals from the components via the test posts). In response to successful testing, the test posts may be covered with shielding structures during step 276 (e.g., shielding structures each formed from an insulating layer 250 and a conductive layer 248 as shown in FIG. 19F). In response to failure of one or more components during testing, the packaged components may be scrapped or, if desired, reworked.

Figure 21:
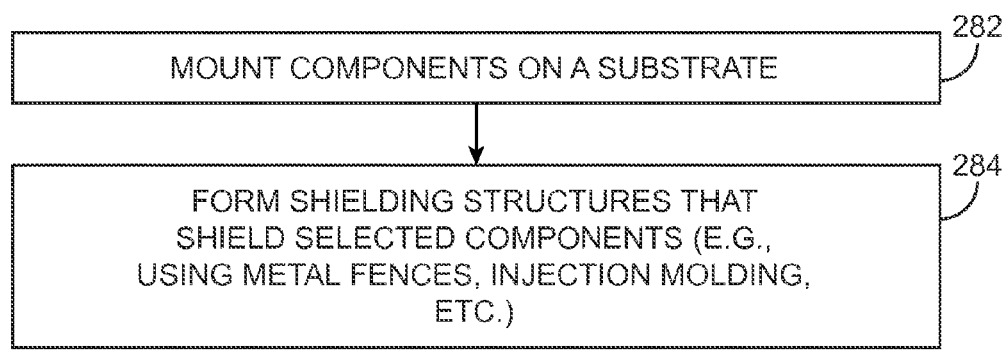
FIG. 21 is a flow chart of illustrative steps involved in selectively shielding components on a substrate in accordance with an embodiment of the present invention.

Electronic components on a substrate may be selectively shielded using any desired electromagnetic shielding structures (e.g., some components may be shielded without shielding other components). FIG. 21 is a flow chart of illustrative steps that may be performed to selectively shield electronic components on a substrate.

In step 282, components such as components 12 may be mounted on a substrate (e.g., substrate 14 or other printed circuit board substrates).

In step 284, shielding structures may be formed using insulating materials and shielding materials around selected components. For example, metal fences may be used to selectively shield a component as shown in FIG. 10. As another example, injection molding may be used to injection mold plastic material over selected components as shown in FIG. 5.

The foregoing is merely illustrative of the principles of this invention and various modifications can be made by those skilled in the art without departing from the scope and spirit of the invention. The foregoing embodiments may be implemented individually or in any combination.

What is claimed is:

1. A printed circuit board, comprising:
   a substrate;
   an electronic component mounted to the substrate;
   an electromagnetic shielding structure formed from metal foil wrapped over at least the electronic component, wherein the metal foil is wrapped around the electronic component and the substrate, wherein the substrate includes a top surface, a bottom surface, and a plurality of side walls, wherein the metal foil covers only the top surface of the substrate and the plurality of side walls, and wherein the metal foil curves directly over the electronic component; and
   a spacer structure interposed between the electronic component and the metal foil, wherein the metal foil has first and second opposing surfaces, wherein the first surface is positioned above the substrate, and wherein the spacer structure contacts only a portion of the first surface.

2. The printed circuit board defined in claim 1 wherein the substrate includes a conductive ground plane and wherein the metal foil is coupled to the conductive ground plane at each side wall of the plurality of side walls.

3. The printed circuit board defined in claim 2 wherein the metal foil is attached to the conductive ground plane using solder.

4. The printed circuit board defined in claim 1 wherein the metal foil has a top surface and a bottom surface, the printed circuit board further comprising:
   an insulating layer attached to the bottom surface of the metal foil.

5. The printed circuit board defined in claim 4 further comprising:
   an additional insulating layer attached to the top surface of the metal foil.

6. The printed circuit board defined in claim 1 wherein the substrate includes a conductive ground plane, the printed circuit board further comprising:
   at least one metal trace on the substrate, wherein the metal foil is coupled to the conductive ground plane through the metal trace.

7. Apparatus, comprising:
   a substrate having opposing top and bottom surfaces;
   first and second electrical components mounted on the top surface of the substrate;

a third electrical component mounted on the bottom surface of the substrate;
a metal foil that is wrapped around the substrate and encloses the first, second, and third electrical components, wherein the metal foil has a non-planar surface that directly overlaps the first, second, and third electrical components; and
an insulating spacer block that is interposed between the first electrical component and the metal foil, wherein the second electrical component and the insulating spacer block are non-overlapping.

8. The apparatus defined in claim 7 wherein the metal foil has first and second opposing surfaces that are each covered by an insulating layer.

\* \* \* \* \*